US 10,056,447 B2

(12) United States Patent
Lee et al.

(10) Patent No.: US 10,056,447 B2
(45) Date of Patent: Aug. 21, 2018

(54) ORGANIC LIGHT EMITTING DISPLAY DEVICE

(71) Applicant: LG Display Co., Ltd., Seoul (KR)

(72) Inventors: SuWoong Lee, Paju-si (KR); YoungSik Jeong, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/904,119

(22) Filed: Feb. 23, 2018

(65) Prior Publication Data

US 2018/0190751 A1 Jul. 5, 2018

Related U.S. Application Data

(62) Division of application No. 14/970,344, filed on Dec. 15, 2015, now Pat. No. 9,941,344.

(30) Foreign Application Priority Data

Oct. 16, 2015 (KR) .................. 10-2015-0144995

(51) Int. Cl.
*H01L 21/00* (2006.01)
*H01L 27/32* (2006.01)
*H01L 51/52* (2006.01)

(52) U.S. Cl.
CPC ...... *H01L 27/3276* (2013.01); *H01L 51/5225* (2013.01); *H01L 51/5271* (2013.01); *H01L 27/322* (2013.01); *H01L 27/3246* (2013.01)

(58) Field of Classification Search
None
See application file for complete search history.

(56) References Cited

U.S. PATENT DOCUMENTS

| | | | | |
|---|---|---|---|---|
| 8,598,610 B2* | 12/2013 | Oda | ..................... | H01L 27/3211 |
| | | | | 257/40 |
| 8,937,311 B2* | 1/2015 | Seo | ........................ | H01L 29/786 |
| | | | | 257/57 |
| 2012/0161141 A1* | 6/2012 | Jeon | ....................... | H01L 27/322 |
| | | | | 257/59 |
| 2014/0183479 A1* | 7/2014 | Park | ....................... | H01L 51/56 |
| | | | | 257/40 |
| 2016/0049615 A1 | 2/2016 | Kim et al. | | |

OTHER PUBLICATIONS

United States Office Action, U.S. Appl. No. 14/970,344, dated Jun. 16, 2017, 8 pages.

* cited by examiner

*Primary Examiner* — Hung Vu
(74) *Attorney, Agent, or Firm* — Fenwick & West LLP

(57) ABSTRACT

Embodiments relate to an organic light emitting display device according to the present disclosure including: a plurality of pixels which includes red, white, blue, and green sub-pixels; driving transistor, each of which is disposed in each sub-pixel; and organic light emitting diodes, each of which is disposed corresponding to each sub-pixel, wherein a first step portion, first and second bank layers, and a first step compensation portion are disposed between the white sub-pixel and a sub-pixel adjacent thereto, thereby having an effect of suppressing a short circuit defect and a light leakage defect. In addition, an organic light emitting display device according to the present disclosure includes: red, white, blue, and green sub-pixels; at least one step portion between the sub-pixels; first and second bank layers; and a step compensation portion, thereby having an effect of suppressing a short circuit defect and a light leakage defect.

10 Claims, 25 Drawing Sheets

ORGANIC LIGHT EMITTING DISPLAY DEVICE

CROSS-REFERENCE TO RELATED APPLICATIONS

This application is a divisional application of U.S. patent application Ser. No. 14/970,344 filed on Dec. 15, 2015, which claims priority from and the benefit under 35 U.S.C. § 119 (a) of Republic of Korea Patent Application No. 10-2015-0144995 filed on Oct. 16, 2015, which are hereby incorporated by reference for all purposes as if fully set forth herein.

BACKGROUND OF THE INVENTION

Field of the Invention

The present disclosure relates to an organic light emitting display device.

Description of the Related Art

Recently, an organic light emitting display device is gaining popularity as a display device due to a fast response speed, high light emission efficiency, high luminance, and a large viewing angle.

In such an organic light emitting display device, sub-pixels including organic light emitting diodes are arranged in a matrix form, and brightness of sub-pixels selected by a scan signal is controlled according to gradation of data.

Each sub-pixel disposed in a display panel of such an organic light emitting display device may basically include a driving transistor which drives an organic light emitting diode, a switching transistor which transfers data voltage to a gate node of the driving transistor, a storage capacitor which plays a role of keeping predetermined voltage during one frame period, and the like.

Meanwhile, the sub-pixels disposed in the organic light emitting display device may be defined as a pixel including sub-pixels of red (R), green (G), blue (B), and white (W) as one unit. In each sub-pixel, organic light emitting diodes generating a specific light wavelength for embodying a color are disposed, or a white (W) organic light emitting diode generating white (W) light is commonly disposed in each sub-pixel, and then a color filter for restricting a specific light wavelength or moving a wavelength band of light may be disposed.

As described above, when the color filters are disposed in the sub-pixels, the white (W) organic light emitting diodes are commonly disposed in the entire display panel, and thus, a light leakage defect may occur in a peripheral area of the sub-pixel where no color filter is provided.

Particularly, since a separate color filter is not disposed in the white (W) sub-pixel, a light leakage defect frequency occurs between adjacent sub-pixels than between different sub-pixels.

As described above, since the light leakage defect occurs along the peripheral of each sub-pixel in the organic light emitting display device, techniques for suppressing the light leakage defect have been proposed. For example, a part of a flat film around a sub-pixel having a light leakage defect is removed to make a gap between organic light emitting diodes and a substrate narrow, thereby reducing the light leakage.

However, when the flat film around the sub-pixel is removed, a risk of a short circuit defect with respect to electrodes of organic light emitting diodes and signal lines (data lines, reference voltage lines, and the like) increases.

SUMMARY OF THE INVENTION

Embodiments relate to an organic light emitting diode (OLED) device including a white subpixel, a first subpixel adjacent to the white subpixel, and a first region between the white subpixel and the first subpixel. The white subpixel comprises a first driving transistor, a first portion of a planarization layer and a first OLED on the first portion of the planarization layer. The first subpixel comprises a second driving transistor, a first portion of a first color filter, a second portion of the planarization layer and a second OLED on the second portion of the planarization layer. The first region comprises a filter layer, a first bank layer on or over the filter layer, and a second bank layer on or over the filter layer. The filter layer comprises a second portion of the first color filter.

In one embodiment, the first bank layer and the second bank layer contact the filter layer.

In one embodiment, the first bank layer extends over an electrode of the first OLED. The second bank layer extends over an electrode of the second OLED.

In one embodiment, the organic light emitting diode (OLED) device further includes a first data line extending along the first bank layer below the first bank layer; and a second data line extending along the second bank layer below the second bank layer.

In one embodiment, the filter layer further comprises a second color filter of a different color than the first color filter.

In one embodiment, the first layer further comprises a third color filter of a different color than the first and second color filters.

In one embodiment, the second portion of the first color filter is thicker than the first portion of the first color filter.

In one embodiment, the organic light emitting diode further comprises a second subpixel adjacent to the white subpixel at an opposite side of the first subpixel and a second region. The second subpixel comprises a third driving transistor, a first portion of a second color filter, a third portion of the planarization layer and a third OLED on the third portion of the planarization layer. The second region is between the white subpixel and the second subpixel. The second region comprises a first bank layer on an electrode of the first OLED and a second bank layer on an electrode of the third OLED.

In one embodiment, the organic light emitting diode includes a conductive line of opaque material extending along the second region.

In one embodiment, the second region further comprises a second portion of the second color filter.

Embodiments also relate to a method of manufacturing an organic light emitting diode (OLED) device. Color filters are formed in subpixels of color other than white and filter layers in regions between white subpixels and the subpixels of colors other than white. A planarization layer is formed at least over the color filters. First electrodes are formed in the subpixel of color other than white and the white subpixels. Portions of the planarization layer in the regions between the white subpixels and the subpixels of colors other than white are removed. Bank layers are formed in the regions on or over the filter layers and over the first electrodes.

BRIEF DESCRIPTION OF THE DRAWINGS

The above and other aspects, features and other advantages of the present invention will be more clearly under

DETAILED DESCRIPTION OF THE PREFERRED EMBODIMENT

Figure 1:
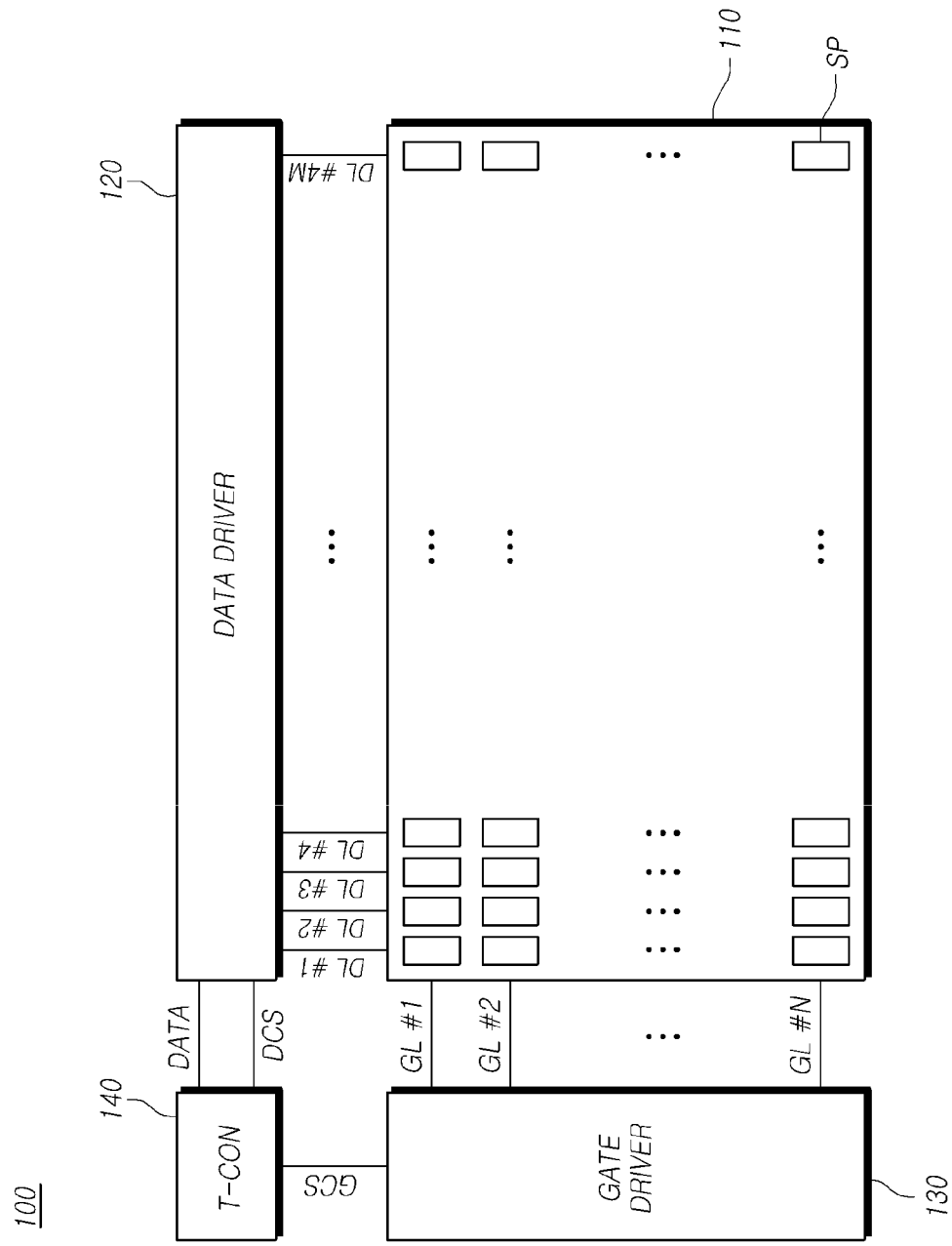
- FIG. 1 is a block diagram illustrating an organic light emitting display device according to the present disclosure.

Advantages, features, and method for achieving them of the present disclosure will be clarified with reference to embodiments to be described later in detail with the accompanying drawings. However, the present disclosure is not limited to the embodiments disclosed hereinafter, and may be embodied in various forms different from each other, the embodiments is merely to complete the present disclosure, and is to provide for those skilled in the art to completely know the scope of the present disclosure, and the present disclosure is only defined by the scope of Claims.

Shapes, sizes, ratios, angles, and quantities illustrated in the drawings for describing the embodiments of the present disclosure are exemplary, and the present disclosure is not limited to the drawings. Throughout the specification, the same reference signs indicate the same constituent elements. In addition, in describing the present disclosure, when it is determined that specific description for the related known technique may unnecessarily blur the gist of the present disclosure, detailed description thereof is omitted.

When 'include', 'have', 'comprise', and the like mentioned in the specification are used, another part may be added as long as 'only' is not used. When a constituent element is expressed singularly, it includes a case of including plurality as long as there is no specific description.

In interpreting constituent elements, an error range is included although there is no separate description.

In the case of describing positional relations, when a positional relation of two parts is described, for example, by 'on', 'above', 'under', 'below', 'adjacent to', and the like, one or more other parts may be positioned between two parts as long as 'immediately' or 'directly' is not used.

In the case of describing time relations, when a time sequence relation is described, for example, by 'after', 'subsequent to', 'next', 'before', and the like, a discontinuous case may be also included as long as 'immediately' or 'directly' is not used.

First, second, and the like are used to describe various constituent elements, but these constituent elements are not restricted by these terms. These terms are merely used to discriminate one constituent element from the other constituent element. Accordingly, a first constituent element mentioned hereinafter may be a second constituent element in the technical spirit of the present disclosure.

Features of various embodiments of the present disclosure can be partially and integrally coupled and combined with each other, various interlocking and driving can be technically performed, and each embodiment can be embodied independently from each other, and may be performed together in relation.

Hereinafter, embodiments of the present disclosure will be described in detail with reference to the drawings. In the drawings, sizes, thicknesses, and the like of a device may be exaggeratedly expressed for convenience. Throughout the specification, the same reference signs denote the same constituent elements.

Figure 2:
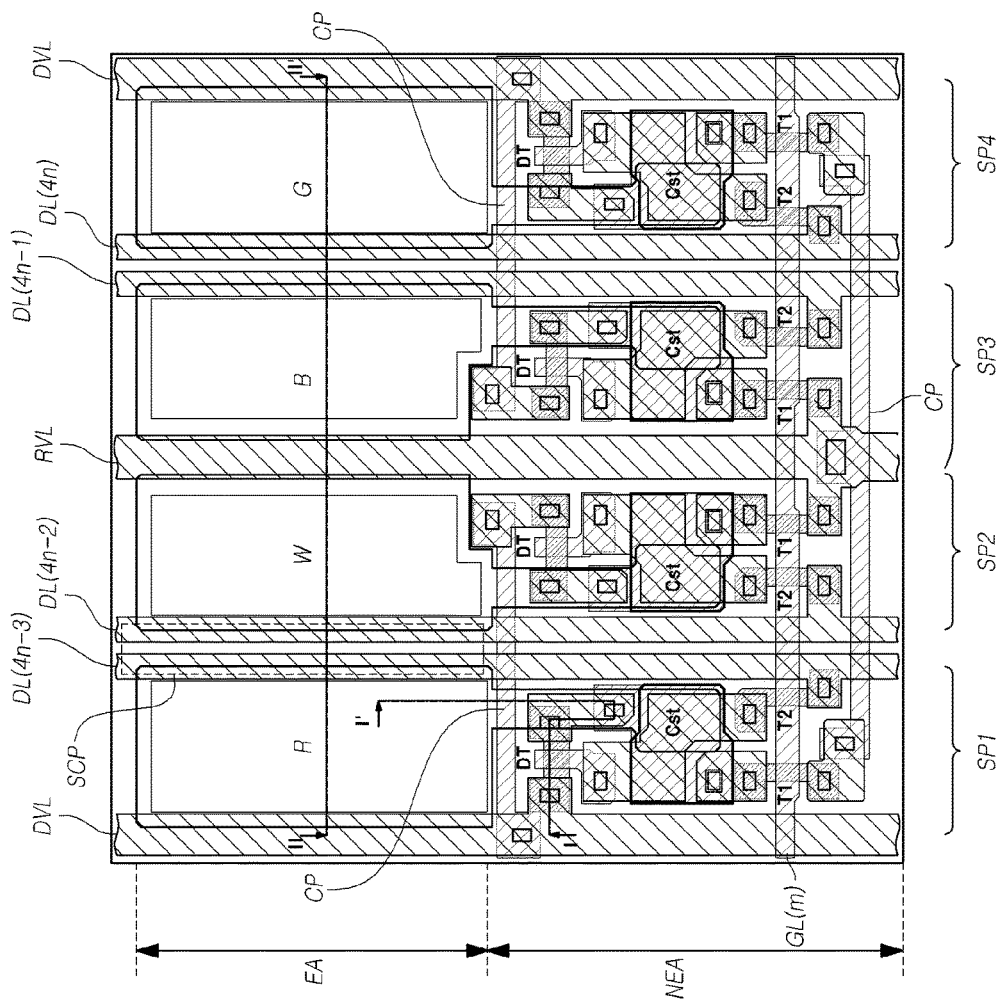
FIG. 2 is a plan view illustrating a pixel structure disposed in a display panel of an organic light emitting display device of the present disclosure.
Figure 3A:
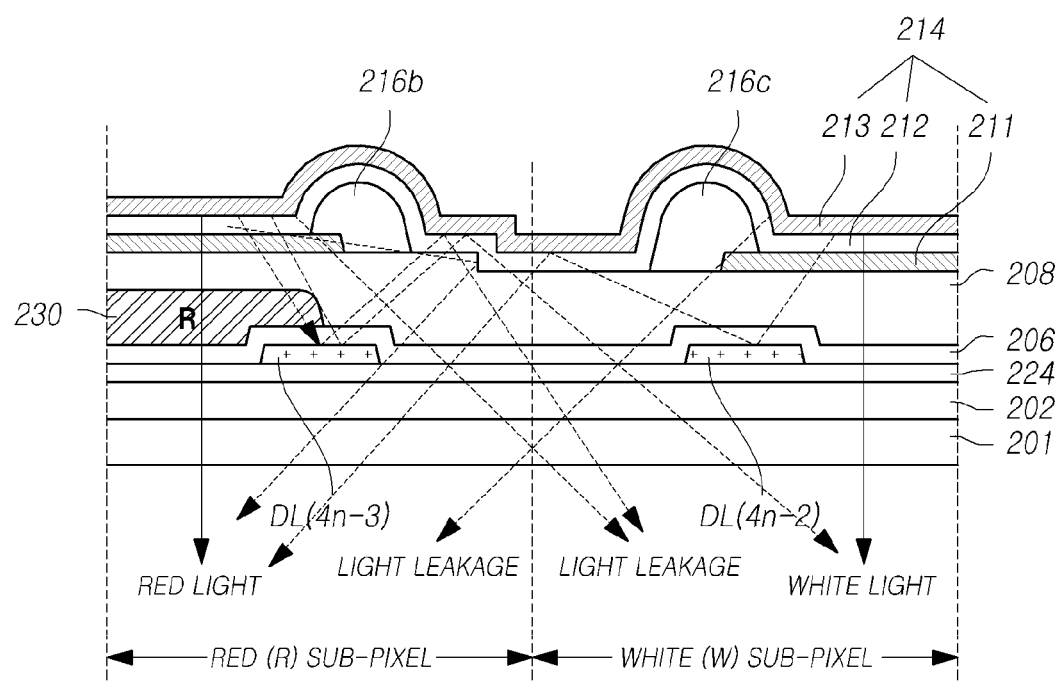
FIG. 3A is a diagram illustrating a light leakage defect occurring between sub-pixels in an organic light emitting display device.
Figure 3B:
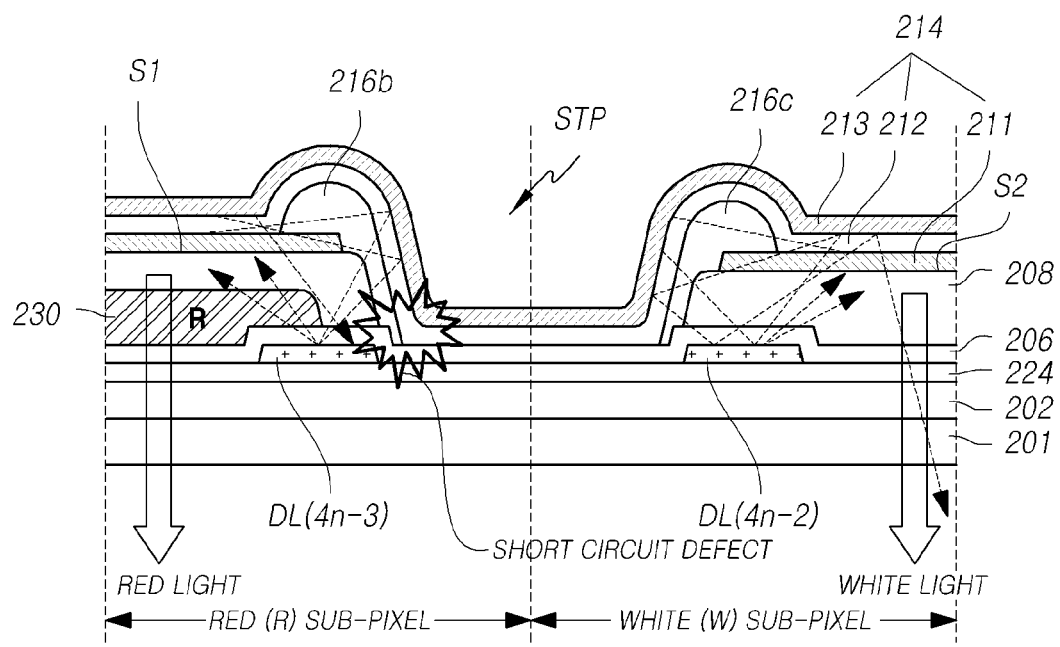
FIG. 3B is a diagram for explaining a short circuit defect occurring when there is no flat film between sub-pixels in an organic light emitting display device.

FIG. 1 is a block diagram of an organic light emitting display device according to the present disclosure, FIG. 2 is a plan view illustrating a structure of a pixel in a display panel of an organic light emitting display device of the present disclosure, FIG. 3A is a diagram for explaining a light leakage defect occurring between sub-pixels in an organic light emitting display device, and FIG. 3B is a diagram for explaining a short circuit defect occurring when there is no flat film between sub-pixels in an organic light emitting display device.

Referring to FIG. 1 through FIG. 3b, an organic light emitting display device 100 according to the present disclosure includes: a display panel 110 in which a plurality of data lines (DL #1 through DL #4M where M is a natural number) are disposed in a first direction (for example, column direction), a plurality of gate lines (GL #1 through GL #N where N is a natural number) are disposed in a second direction (for example, row direction), and a plurality of sub-pixels SP are disposed in a matrix form; a data driver 120 which drives the plurality of data lines (DL #1 through DL #4M); a gate driver 130 which drives the plurality of gate lines (GL #1 through GL #N); and a timing controller T-CON 140 which controls the data driver 120 and the gate driver 130.

The data driver 120 drives the plurality of data lines by supplying data voltage to the plurality of data lines (DL #1 through DL #4M).

The gate driver 130 sequentially drives the plurality of gate lines (GL #1 through GL #N) by sequentially supplying a scan signal to the plurality of gate lines (GL #1 through GL #N).

The timing controller 140 supplies various control signals to the data driver 120 and the gate driver 130 to control the data driver 120 and the gate driver 130.

The gate driver 130 sequentially supplies a scan signal of on-voltage or off-voltage to the plurality of gate lines (GL #1 through GL #N) according to the control of the timing controller 140, to drive the plurality of gate lines (GL #1 through GL #N).

The gate driver 130 may be positioned only on one side or (as illustrated in FIG. 1) on both sides of the display panel 110.

The data driver 120 converts image data received from the timing controller 140 into analog data voltage, and supplies the analog data voltage to the plurality of data lines (DL #1 through DL #4M), thereby driving the plurality of data lines (DL #1 through DL #4M).

In the organic light emitting display device 100 according to the present disclosure, each sub-pixel SP disposed in the display panel 110 includes circuit elements such as an organic light emitting diode OLED, two or more transistors, and at least capacitor.

Kinds and the number of circuit elements constituting each sub-pixel may be variously determined according to provided functions, design ways, and the like.

Each sub-pixel in the display panel 110 according to the present disclosure may have a circuit structure for compensating for sub-pixel characteristic values such as characteristic values (for example, threshold voltage, and the like) of an organic light emitting diode OLED and characteristic values (for example, threshold voltage, mobility, and the like) of a driving transistor driving the organic light emitting diode OLED.

Referring to FIG. 1 and FIG. 2, each sub-pixel SP is connected to one data line DL and receives only one scan signal SCAN supplied through one gate line GL.

As illustrated in FIG. 2, such a sub-pixel includes an organic light emitting diode OLED, a driving transistor DT, a first transistor T1, a second transistor T2, a storage capacitor Cst, and the like. As described above, since each sub-pixel includes three transistors DT, T1, and T2 and one storage capacitor Cst, each sub-pixel has a 3T (transistor) 1C (capacitor) structure.

In addition, the first transistor T1 is controlled by a scan signal SCAN supplied through the gate line GL, and is connected between a reference voltage line RVL supplying reference voltage Vref or a connection pattern CP connected to the reference voltage line RVL and the driving transistor DT. Such a first transistor T1 is also referred to as "sensor transistor."

In addition, the second transistor T2 is controlled by a scan signal SCAN commonly supplied through the gate line GL, and is connected to the data line DL and the driving transistor DT. Such a second transistor T2 is also referred to as "switching transistor."

As described above, the first transistor T1 and the second transistor T2 are controlled by one scan signal supplied through the same gate line (common gate line). As such, since each sub-pixel uses one scan signal, in the embodiment of the present disclosure, each sub-pixel has a basic sub-pixel structure of "3T1C-based 1 scan structure".

However, variations to such structures are possible. For example, the first transistor T1 and the second transistor T2 may be connected to a gate line and a sensing line, respectively, and such a structure is referred to as "3T1C-based 2 scan structure".

Meanwhile, the sub-pixel structure of the organic light emitting display device 100 according to the present disclosure also includes "signal line connection structure" in which each sub-pixel is connected to various signal lines such as a data line DL, a gate line GL, a driving voltage line DVL, a reference voltage line RVL, and the like, in addition to "basic sub-pixel structure (3T1C-based 1 scan structure)" described with reference to FIG. 2.

Herein, the signal lines further include a reference voltage line RVL for supplying reference voltage Vref to each sub-pixel, a driving voltage line for supplying driving voltage EVDD to each sub-pixel, and the like, as well as a data line DL for supplying data voltage to each sub-pixel and a gate line GL for supplying a scan signal.

In addition, in the specification and the drawings, a sub-pixel connected to a (4n-3)th data line DL(4n-3), a sub-pixel connected to a (4n-2)th data line DL(4n-2), a sub-pixel connected to a (4n-1)th data line DL(4n-1), and a sub-pixel connected to a 4n-th data line DL(4n) may be a red (R) sub-pixel, a white (W) sub-pixel, a blue (B) sub-pixel, and a green (G) sub-pixel, respectively, as an example.

However, various other embodiments are possible. For example, sequence of the red (R) sub-pixel, the white (W) sub-pixel, the blue (B) sub-pixel, and the green (G) sub-pixel may be variously modified and disposed. Herein, embodiments are described primarily with reference to a pixel structure having a sequence of the red (R) sub-pixel SP1, the white (W) sub-pixel SP2, the blue (B) sub-pixel SP3, and the green (G) sub-pixel SP4.

As described above, when a basic unit of the signal line connection structure is four sub-pixels SP1 to SP4 connected to four data lines DL(4n-3), DL(4n-2), DL(4n-1), and DL(4n), respectively, one reference voltage line RVL for supplying reference voltage Vref may be formed, and two driving voltage lines DVL for supplying driving voltage EVDD may be formed, for four sub-pixels SP1 to SP4.

Each of the sub-pixels SP1, SP2, SP3, and SP4 includes an emission area EA in which an organic light emitting diode OLED is disposed, and a non-emission area NEA.

Further, the non-emission area NEA includes an area in which the reference voltage line RVL, the driving voltage line DVL, and the data lines DL are disposed.

Referring to FIG. 2, four data lines DL(4n-3), DL(4n-2), DL(4n-1), and DL(4n) are connected to four sub-pixels SP1 to SP4, respectively. In addition, one gate line GL(m) (1≤m≤M) is connected to four sub-pixels SP1 to SP4.

In the present disclosure, a step compensation portion SCP is disposed between the red (R) sub-pixel SP1 and the white (W) sub-pixel SP2, to suppress a short circuit defect between an anode (pixel electrode) disposed in the red (R) sub-pixel SP1 in the step portion and an anode (pixel electrode) disposed in the white (W) sub-pixel SP2.

The step compensation portion SCP is overlapped with the data lines DL(4n-3) and DL(4n-2) disposed between the red (R) sub-pixel SP1 and the white (W) sub-pixel SP2, and may be formed in a laminated structure of at least one color pattern. A specific structure of the step compensation portion SCP will be described in detail below.

Figure 16:
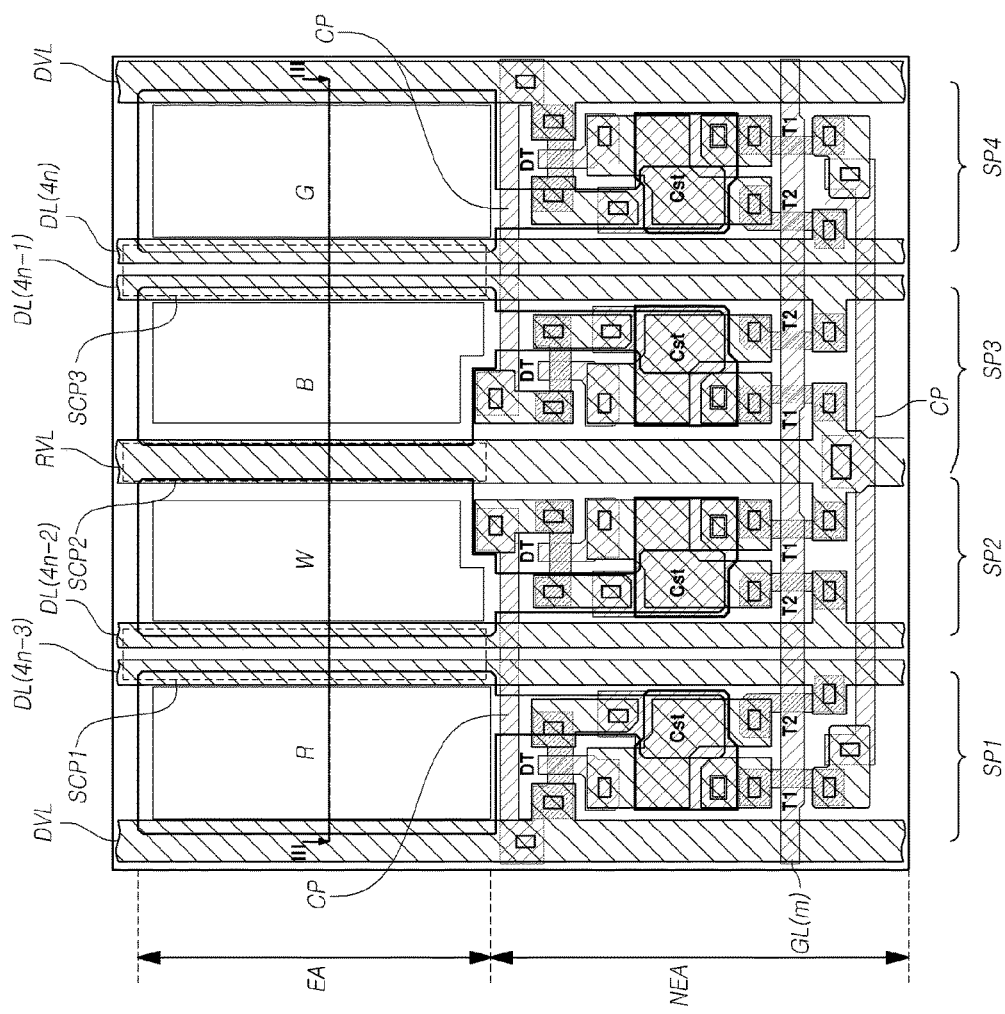
FIG. 16 is a plan view illustrating a structure of a pixel disposed in a display panel of an organic light emitting display device according to another embodiment of the present disclosure.
Figure 17:
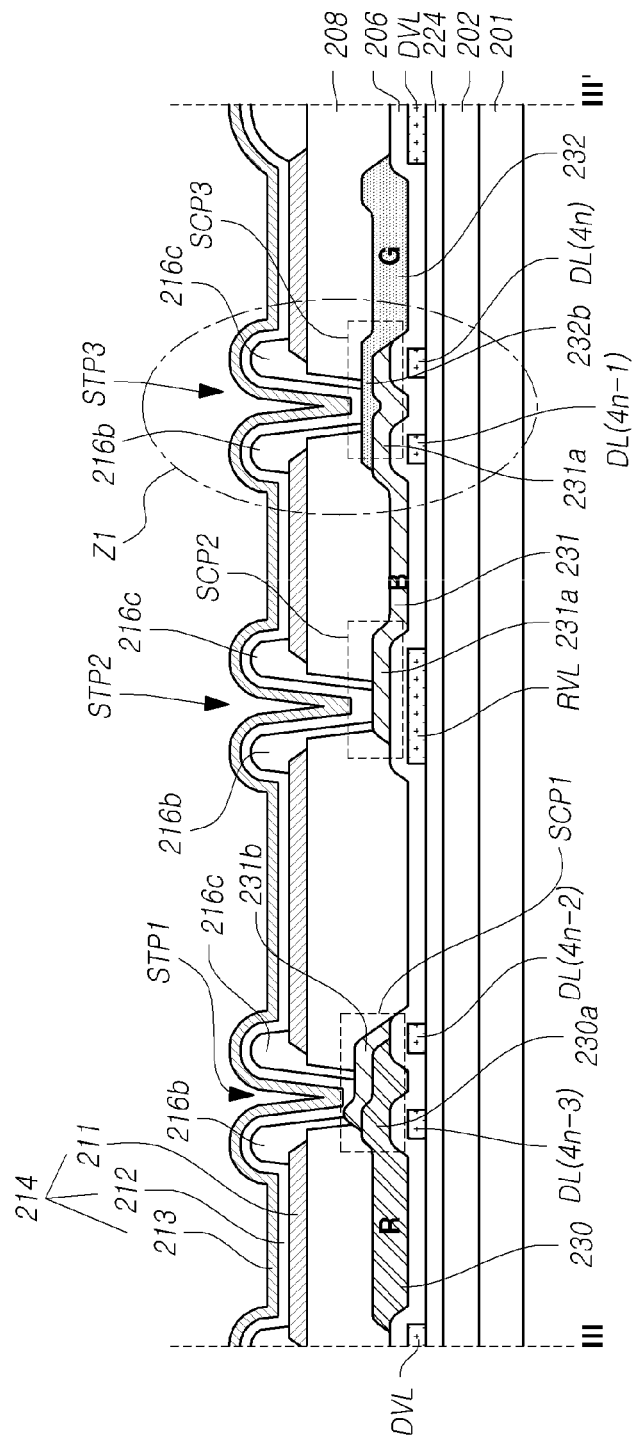
FIG. 17 is a cross-sectional view taken along line of FIG. 16.

In FIG. 2 as an embodiment of the present disclosure, the step compensation portion SCP is disposed only between the red (R) sub-pixel SP1 and the white (W) sub-pixel SP2. However, other embodiments may use the step compensation portion SCP in different arrangements. For example, as illustrated in FIG. 16 and FIG. 17, step portions may be formed among the sub-pixels SP1, SP2, SP3, and SP4, and a step compensation portion SCP may be disposed in each step portion area.

When the step compensation portions SCP are disposed among the sub-pixels SP1, SP2, SP3, and SP4, the step compensation portions SCP may be overlapped with the reference voltage line RVL between the white (w) sub-pixel SP2 and the blue (B) sub-pixel SP3, may be overlapped with the data lines DL(4n-1) and DL(4n) between the blue (B) sub-pixel SP3 and the green (G) sub-pixel SP4, and may be overlapped with the driving voltage line DVL between the green (G) sub-pixel SP4 and the red (R) sub-pixel SP1.

In the organic light emitting display device 100 according to the present disclosure, an organic light emitting diode OLED generating white (W) light is commonly disposed in each sub-pixel, a red (R) color filter is disposed in the red (R) sub-pixel SP1, a blue (B) color filter is disposed in the blue (B) sub-pixel SP3, and a green (G) color filter is disposed in the green (G) sub-pixel SP4. A separate color filter is not disposed in the white (W) sub-pixel SP2.

Referring to FIG. 3A, the data lines DL(4n-3) and DL(4n-2) are disposed on a substrate 201 between the red (R) sub-pixel and the white (W) sub-pixel. In the substrate 210, an interlayer insulating film 224 and a buffer layer 202 are laminated, and a protective film 206 is formed on the data lines DL(4n-3) and DL(4n-2). In addition, a red color filter 230 is disposed in the red (R) sub-pixel area, and no color filter is disposed in the white (W) sub-pixel area.

A flat film 208 is disposed on a front face of the substrate 201 on which the red color filter 230 is formed. The flat film 208 also has a function of suppressing outgassing generated in the color filters disposed in the sub-pixels from being transferred to the organic light emitting diode 214 disposed on the flat film 208.

As illustrated in FIG. 3A, there is the flat film 208 between the red (R) sub-pixel and the white (W) sub-pixel, and the first and second bank layer 216b and 216a areas and the data lines DL(4n-3) and DL(4n-2) are separated from each other. Accordingly, when light travels in a direction between the red (R) sub-pixel and the white (W) sub-pixel of light generated in the organic light emitting diode 214, light leakage occurs in an area between the data lines DL(4n-3) and DL(4n-2) while light travels the flat film 208.

More specifically, due to the height difference of the area between the data lines DL(4n-3) and DL(4n-2) and the structure in which the color filter is not disposed in the white (W) sub-pixel, a step-like feature occurs on the surface of the flat film 208 between the red (R) sub-pixel and the white (W) sub-pixel. Accordingly, in the area between the red (R) sub-pixel and the white (W) sub-pixel, significant amount of reflection, refraction, scattering, and the like of traveling light occur, referred to as a light leakage defect. In order to remove such a light leakage defect, as illustrated in FIG. 3B, a technique of forming a step portion STP by removing a flat film between the red (R) sub-pixel and the white (W) sub-pixel has been proposed.

When a step portion STP is formed as illustrated in FIG. 3B, a flat film 208 is disposed on a front face of a substrate 201 on which the red color filter 230 is formed, the flat film 208 is removed between the red (R) and white (W) sub-pixels, and a protective film 206 is exposed, thereby forming a step portion STP. In each sub-pixel area of the substrate 201 on which the flat film 208 is formed, an organic light emitting diode 214 including a first electrode 211 (anode or pixel electrode), an organic light emitting layer 212, and a second electrode 213 (cathode or common electrode) is disposed.

Referring to FIG. 3B, the organic light emitting layer 212 and the second electrode 213 of the organic light emitting diode 214 are positioned in the step portion STP, and light traveling to an interface between the red (R) sub-pixel and the white (W) sub-pixel is reflected towards the corresponding sub-pixel, thereby decreasing light leakage. However, the organic light emitting layer 212 and the second electrode 213 are positioned on the protective film 206 exposed due to the step portion STP, and thus the second electrode 213 and the data lines DL(4n-3) and DL(4n-2) becomes close and may cause short circuiting of data lines and the second electrode 213.

In addition, although not illustrated clearly in the drawings, since the red color filter 230 is disposed in the red (R) sub-pixel area and no color filter is disposed in the white (W) sub-pixel, a first surface S1 of the flat film 208 corresponding to the red (R) sub-pixel is formed to be higher than a second surface S2 of the flat film 208 corresponding to the white (W) sub-pixel.

Accordingly, in the case of forming the first electrode 211 (pixel electrode) of the organic light emitting diode 214, when a photosensitive film is applied, a photosensitive film in the step portion STP and the second face S2 (white sub-pixel area) area is thicker than a photosensitive film in the first face S1 area, and a residual photosensitive film remains even after a photolithographic process. Such a residual photosensitive film causes the pixel electrode (first electrode) formed in the white (W) sub-pixel area to be expanded towards the step portion STP area during an etching process, and causes a short circuit defect with the pixel electrode (first electrode) formed in the adjacent red (R) sub-pixel.

Accordingly, in the organic light emitting display device 100 according to the present disclosure, step compensation portions SCP including color patterns are formed at the time of forming the red (R), blue (B), and green (G) color filters in the step portion STP of the red (R) sub-pixel and the white (W) sub-pixel to suppress a short circuit defect between pixel electrodes and a short circuit defect between the pixel electrode and the data line.

In addition, since the step compensation portion SCP includes color patterns, it is possible to reduce or remove light leakage occurring in the step portion STP area.

Figure 4:
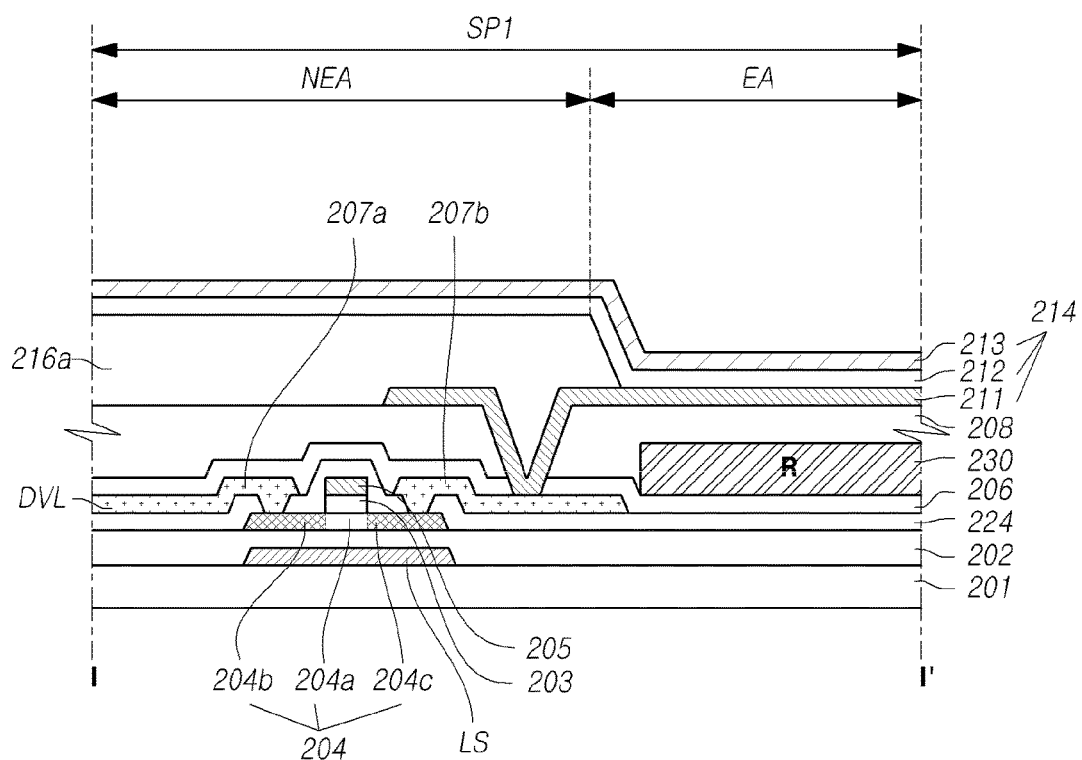
FIG. 4 is a cross-sectional view taken along line I-I' of FIG. 2.
Figure 5:
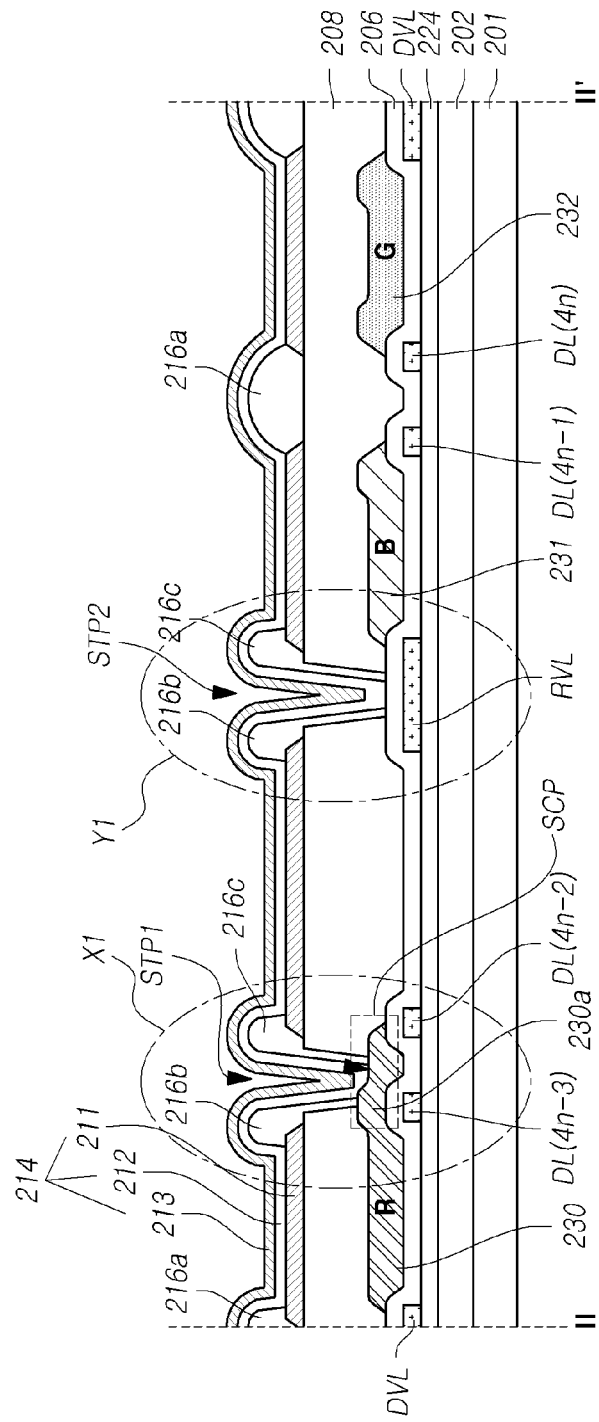
FIG. 5 is a cross-sectional view taken along line II-II' of FIG. 2.
Figure 6:
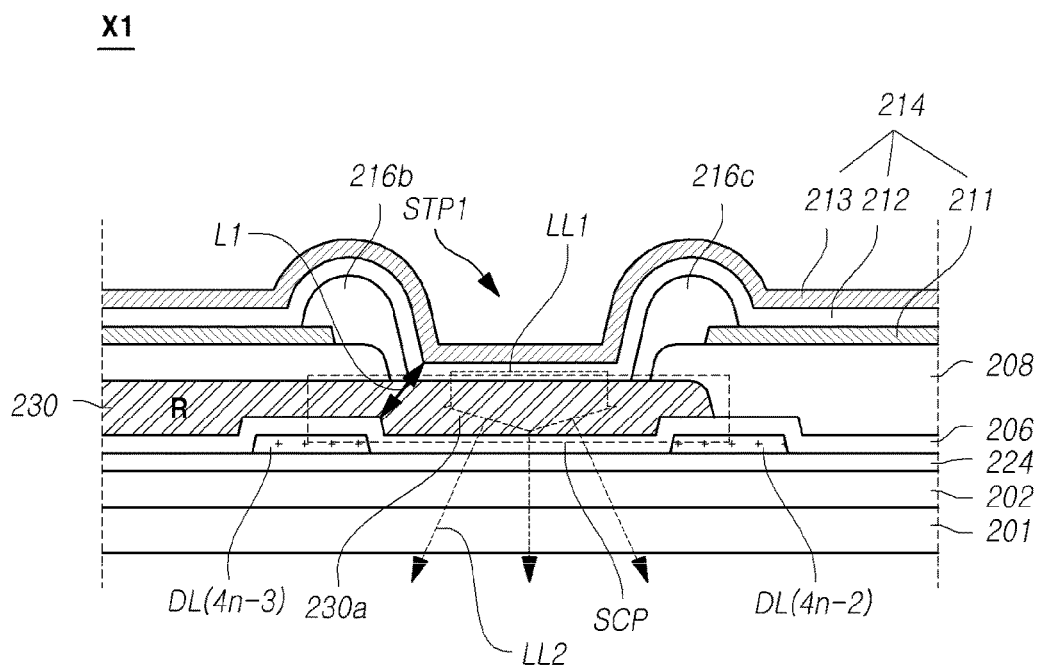
FIG. 6 is an enlarged cross-sectional view of a first step portion area (X1) of FIG. 5.
Figure 7:
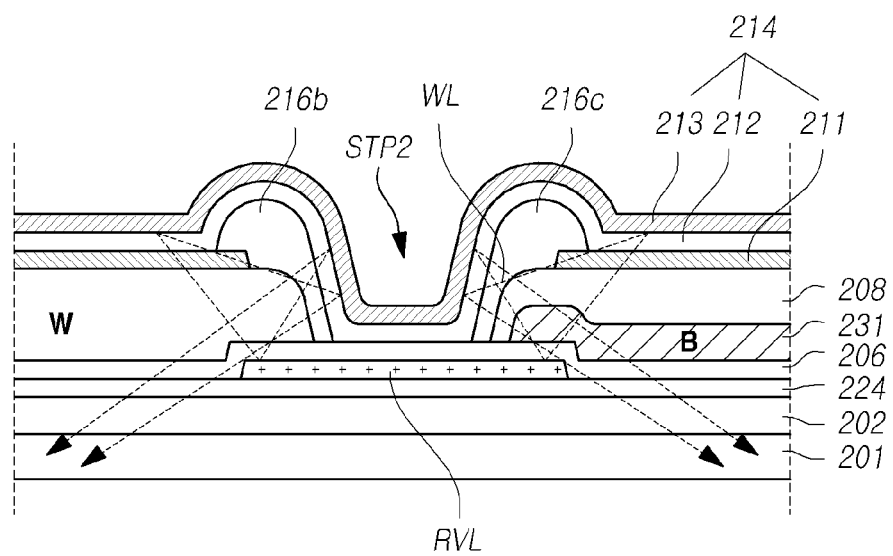
FIG. 7 is an enlarged cross-sectional view of a second step portion area (Y2) of FIG. 5.

FIG. 4 is a cross-sectional view taken along the line I-I' of FIG. 2, FIG. 5 is a cross-sectional view taken along the line II-II' of FIG. 2, FIG. 6 is an enlarged cross-sectional view of a first step portion area X1 of FIG. 5, and FIG. 7 is an enlarged cross-sectional view of a second step portion area (Y1) of FIG. 5.

Referring back to FIG. 2, in the organic light emitting display device 100 according to the present disclosure, the plurality of sub-pixels SP1, SP2, SP3, and SP4 are defined as one pixel, and the plurality of pixels are disposed in a matrix form in the display panel 110.

Each sub-pixel SP constituting the pixel includes an emission area EA in which an organic light emitting diode OLED 214 is disposed, and a non-emission area NEA in which a driving transistor DT, a first transistor T1 that is a switching transistor, a second transistor T2 that is a sensor transistor, and a storage capacitor Cst are disposed.

Referring to FIG. 4 and FIG. 5, a driving transistor DT, an organic light emitting diode 214, and a red (R) color filter 230 of the red (R) sub-pixel SP1 of FIG. 2 are illustrated. A separate color filter is not disposed in the white (W) sub-pixel SP2 of FIG. 2, and is filled with a flat film 208. In addition, a blue (B) color filter 231 and a green (G) color filter 232 are disposed in the blue (B) sub-pixel SP3 and the green (G) sub-pixel SP4, respectively.

In the organic light emitting display device according to the present disclosure, a light shield layer LS is disposed on the substrate 201, and a buffer layer 202 is disposed on the light shield layer LS. A driving transistor DT including an active layer 204, a gate pattern 203, a gate electrode 205, an interlayer insulating film 224, and drain and source electrodes 207a and 207b is disposed on the buffer layer 202.

Herein, the drain electrode 207a is connected to the driving voltage line DVL, and the source electrode 207b is connected to the first electrode 211 of the organic light emitting diode 214.

In addition, the active layer 204 is formed of a semiconductor layer, and a center portion thereof includes an active area 204a forming a channel and drain and source areas 204b and 204c. High-concentration impurities are doped on both sides of the active area 204a.

The semiconductor layer may be formed of a silicon-based material or an oxide semiconductor material including zinc (Zn), for example, zinc oxide (ZnO), indium gallium zinc oxide (InGaZnO4), or the like may be used, but it not limited thereto.

The organic light emitting display device according to the present disclosure may be an top light emission type or a bottom light emission type, but herein the bottom light emission organic light emitting display device is described for the sake of convenience. In addition, in the present disclosure, it will be mainly described that an organic light emitting diode 214 generating white (W) light is commonly disposed in each of the sub-pixels SP1 to SP4, and color filters are disposed in the red (R), blue (B), and green (G) sub-pixel SP1, SP3, and SP4 areas.

The red (R) color filter 230, the blue (B) color filter 231, and the green (G) color filter 232 may be disposed between the flat film 208 and the protective film 206 disposed on the driving transistor DT. However, various embodiments are possible. For examples, the color filters may be formed between the interlayer insulating film 224 and the buffer layer 202, between the buffer layer 202 and the substrate 201, or between the interlayer insulating film 224 and the protective film 206.

In addition, the organic light emitting diode 214 is disposed on the flat film 208 disposed on the driving transistor DT, and includes the first electrode 211 formed of a transparent conductive material, the organic light emitting layer 212, and the second electrode 213. A sealing layer (not illustrated) having a plurality of organic films and inorganic films laminated may be further formed on the organic light emitting diode 214. In addition, a polarizing plate may be further disposed on the back face of the substrate 201.

The first electrode 211 of the organic light emitting diode 214 is a pixel electrode serving as an anode, and is independently disposed in each of the sub-pixels SP1, SP2, SP3, and SP4. The first electrode 211 is disposed in an open area of a bank layer for partitioning the sub-pixels SP1 to SP4 on the flat film 208.

In addition, the first electrode 211 of the organic light emitting diode 214 may be formed of metal, alloy thereof, and combination of metal and metal oxide, and the metal may be preferably a transparent conductive material since it is the lower light emission type. The first electrode 211 may be formed of any one of ITO, IZO, ITO/APC/ITO, AlNd/ITO Ag/ITO and ITO/APC/ITO.

In order to raise light emission efficiency, the organic light emitting layer 212 may be configured by a multi-layer of a hole injection layer, a hole transport layer, an emitting material layer, an electro transport layer, and an electron injection layer.

In addition, the hole transport layer HTL may further include an electro block layer EBL, and the electron transport layer ETL may be formed using a low molecular material such as PBD, TAZ, Alq3, BAlq, TPBI, and Bepp2.

Referring to FIG. 2 and FIG. 5, the first and second step portions STP1 and STP2 from which the flat film 208 is removed are formed between the red (R) sub-pixel SP1 and the white (W) sub-pixel SP2 and between the white (W) sub-pixel SP2 and the blue (B) sub-pixel SP3. In the first step portion STP1 area, a double bank layer, that is, a first bank layer 216b and a second bank layer 216c are disposed to partition the red (R) sub-pixel SP1 and the white (W) sub-pixel SP2. The first bank layer 216b and the second bank layer 216c are formed in a structure of facing each other with the step portion interposed between them.

However, between sub-pixels in which the first and second step portions STP1 and STP2 are not formed, for example, between the blue (B) sub-pixel and the green (G) sub-pixel, a single bank layer 216a is disposed to partition the sub-pixels. Referring to FIG. 5, the single bank layer 216a is disposed between the blue (B) sub-pixel SP3 and the green (G) sub-pixel SP4 and between the red (R) sub-pixel SP1 and the green (G) sub-pixel SP4, in which the step portion is not formed.

More specifically, in the structure of the double bank layer, the first bank layer 216b is disposed to come in contact with a part of the first electrode 211 disposed in the red (R) sub-pixel SP1, the upper face of the flat film 208, the inner face (side of an area in which the flat film 208 is removed) of the first step portion STP1, and the upper face of the step compensation portion SCP disposed in the first step portion STP1.

Similarly, the second bank layer 216b is disposed to come in contact with a part of the first electrode 211 disposed in the white (W) sub-pixel SP2, the upper face of the flat film 208, the inner face of the first step portion STP1, and a part of the upper face of the step compensation portion SCP disposed in the first step portion STP1. The disposition structure of the first bank layer 216b and the second bank layer 216c has the same form even in the second step portion STP2 area formed between the white (W) sub-pixel SP2 and the blue (B) sub-pixel SP3, however, when the step compensation portion is not disposed in the second step portion STP2 area, as illustrated in FIG. 5, the downside of the first and second bank layers 216b and 216c comes in contact with the protective film 206.

In addition, the step compensation portion SCP disposed in the first step portion STP1 is positioned under the first step portion STP1, and thus the depth of the first step portion STP1 can be adjusted by the step compensation portion SCP. Accordingly, a distance (L1 in FIG. 6) between the data lines DL(4n-3) and DL(4n-2) and the second electrode 213 of the organic light emitting diode disposed in the first step portion STP1 is increased by the thickness of the step compensation portion SCP.

The first bank layer 216b and the second bank layer 216c are formed in a structure separated from each other in the first and second step portions STP1 and STP2, and the second electrode 213 and the organic light emitting layer 212 of the organic light emitting diode OLED 214 fill the inside of the step portions STP1 and STP2 between the first and second bank layers 216b and 216c. Accordingly, in the first step portion STP1, the organic light emitting layer 212 and the second electrode 213 are disposed on the first and second bank layers 216b and 216c and the step compensation portion SCP, and the distance between the second electrode 213 and the data lines DL(4n-3) and DL(4n-2) is increased.

As described above, according to the organic light emitting display device of the present disclosure, the step compensation portion SCP is disposed in the first step portion STP1 area X1 in which the flat film 208 is removed, and it is possible to suppress short circuiting between pixel electrodes (first electrodes) of the organic light emitting diode due to the formation of the step portion or a short circuit between the second electrode 213 of the organic light emitting diode and the data lines DL(4*n*-3) and DL(4*n*-2).

As illustrated in FIG. 5, the step compensation portion SCP of the present disclosure includes a first red color pattern 230*a* expanded from the red (R) color filter 230, and the first red color pattern 230*a* is disposed on the protective film 206 corresponding to the data lines DL(4*n*-3) and DL(4*n*-2). The first red color pattern 230*a* may be a color pattern formed integrally with the same material as that of the red (R) color filter 230. In addition, although not illustrated in the drawings, the step compensation portion SCP may include a color pattern formed of another blue (B) color filter or green (G) color filter separated from the red (R) color filter (see FIG. 15*a* to FIG. 15*d*). Herein, the first red color pattern expanded from the red (R) color filter 230 will be mainly described.

Referring to FIG. 6, in the first step portion STP1 area X1 of the organic light emitting display device according to the present disclosure, the step compensation portion SCP formed of the first red color pattern 230*a* is disposed. The step compensation portion SCP may be disposed to overlap with a partial area of the data lines DL(4*n*-3) and DL(4*n*-2) and an area between the data lines DL(4*n*-3) and DL(4*n*-2).

Accordingly, the downside of the first and second bank layers 216*b* and 216*c* in the first step portion STP1 is positioned on the first red color pattern 230*a*, and the organic light emitting layer 212 and the second electrode 213 are positioned on the first red color pattern 230*a*. In other words, a distance L1 between the second electrode 213 and the data lines DL(4*n*-3) and DL(4*n*-2) is increased by the thickness of the first red color pattern 230*a* that is the step compensation portion SCP.

Accordingly, in the organic light emitting display device of the present disclosure, since the distance L1 between the second electrode 213 of the organic light emitting diode 214 and the data lines DL(4*n*-3) and DL(4*n*-2) is increased by the step compensation portion SCP, it is possible to suppress short circuiting defect of the second electrode 213 and the data lines DL(4*n*-3) and DL(4*n*-2).

In addition, in the organic light emitting display device according to the present disclosure, the first red color pattern 230*a* is disposed in the first step portion STP1 area X1, and it is possible to reduce a height difference of the flat film 208 disposed in the red (R) sub-pixel and the white (W) sub-pixel. As described above, when the height difference of the flat film 208 is reduced, it is possible to reduce occurrence of a residual photosensitive film in the first step portion STP1 at the time of forming the first electrodes 211 (pixel electrodes) of the organic light emitting diode, and it is possible to suppress a short circuit defect between the first electrodes 211. As described above, the residual photosensitive film remaining to suppress the short circuit defect between the pixel electrodes is similarly to the following case of disposing the step compensation portion in the step portion area.

In addition, since the step compensation portion SCP disposed in the first step portion STP1 area X1 of the present disclosure is embodied with the same color pattern as that of the color filter, it is possible to reduce light leakage occurring between the data lines DL(4*n*-3) and DL(4*n*-2) of the first step portion STP1.

Referring to FIG. 6, the first step portion STP1 is formed between the white (W) sub-pixel and the red (R) sub-pixel, and intensity of first light LL1 traveling towards the first step portion STP1 of the white light generated in the organic light emitting diode 214 can be increased by the step compensation portion SCP. This is because the step compensation portion SCP is disposed in the first step portion STP1 area, the height of the second electrode 213 blocking the light leakage is increased, and space through which the light enters is expanded, as in FIG. 3*b*.

However, since the first light LL1 passes through the step compensation portion SCP in the first step portion STP1, the light intensity is decreased, and the light is output in a form of second light LL2. As described above, since the step compensation portion SCP includes the first red color pattern 230*a*, only the second light LL2 having only the wavelength band of 551 to 650 nm in the first light LL1 (white light) including all wavelength bands of blue, green, and red passes, the other light having the other wavelength bands is absorbed, and thus it is possible to reduce light leakage.

Meanwhile, referring to FIG. 7, the second step portion STP2 is disposed to overlap with the reference voltage line RVL wider than the width of the data line DL with the protective film 206 interposed therebetween. As illustrated in FIG. 7, since the width of the second step portion STP2 is narrower than the width of the reference voltage line RVL, the white light WL of the organic light emitting diode 214 traveling to the second step portion STP2 is blocked at the reference voltage line RVL. In other words, when the white light WL generated in the organic light emitting diode 214 travels in the direction of the second step portion STP2, some of the white light WL is reflected by the second electrode 213 positioned in the second step portion STP2, but some of the white light WL travels towards the reference voltage line RVL, and a light leakage defect does not occur since the reference voltage line RVL is formed of opaque metal.

Figure 8:
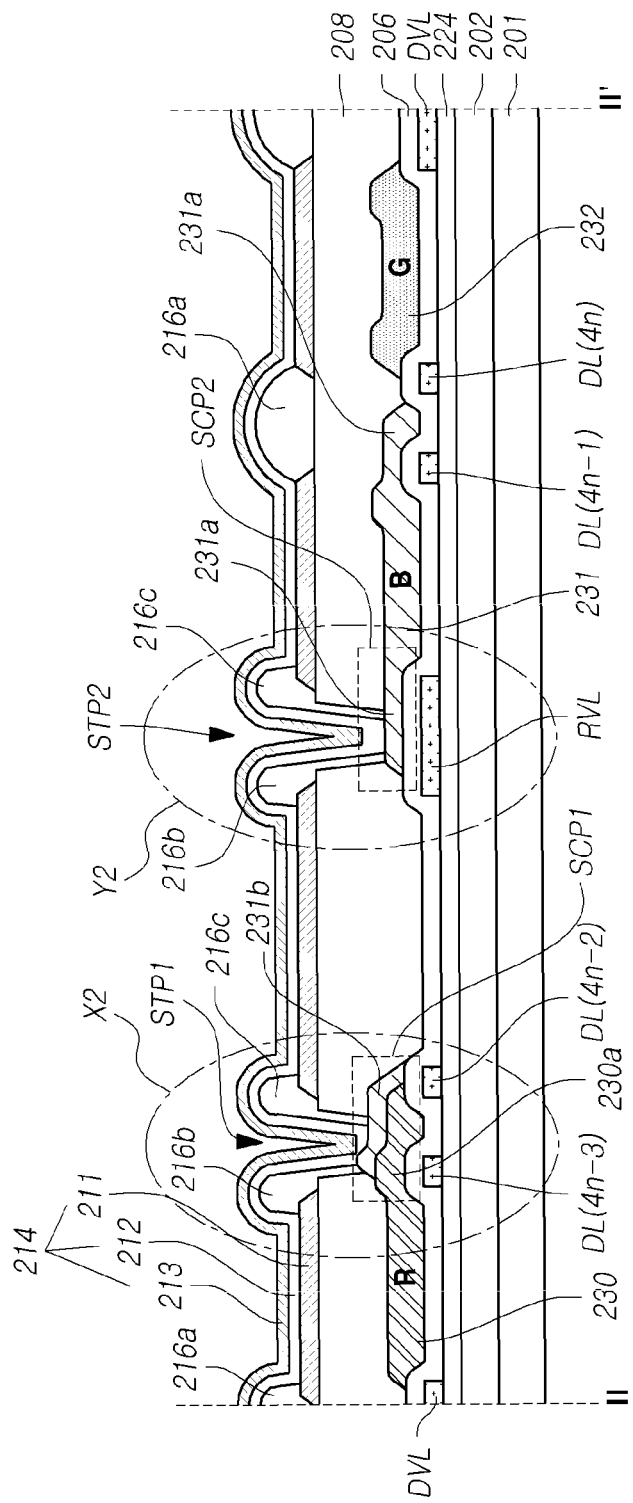
FIG. 8 through FIG. 14 are diagrams illustrating structures of first and second step portions of an organic light emitting display device according to another embodiment of the present disclosure.

FIG. 8 through FIG. 14 are diagrams illustrating structures of first and second step portions of an organic light emitting display device according to another embodiment of the present disclosure. Referring to FIG. 8 in conjunction with FIG. 2, first and second step portions STP1 and STP2 are formed left and right with respect to a white (W) sub-pixel in an organic light emitting display device 100 of the present disclosure.

In an organic light emitting display device according to another embodiment of the present disclosure, first and second step compensation portions SCP1 and SCP2 are disposed in areas X2 and Y2 of first and second step portions STP1 and STP2, respectively.

The first step compensation portion SCP1 may be formed in a structure in which a first red color pattern 230*a* expanded from a red (R) color filter 230 and a second blue color pattern 231*b* are laminated. In the drawing, the structure in which the second blue color pattern 213*b* is laminated on the first red color pattern 230*a* is illustrated, but this is not fixed, and a green color pattern formed at the time of forming a green (G) color filter may be laminated.

In addition, the second step compensation portion SCP2 is disposed in the second step portion STP2, and the second step compensation portion SCP2 is embodied by the first blue color pattern 231*a* expanded and formed from the blue (B) color filter 231.

Figure 9:
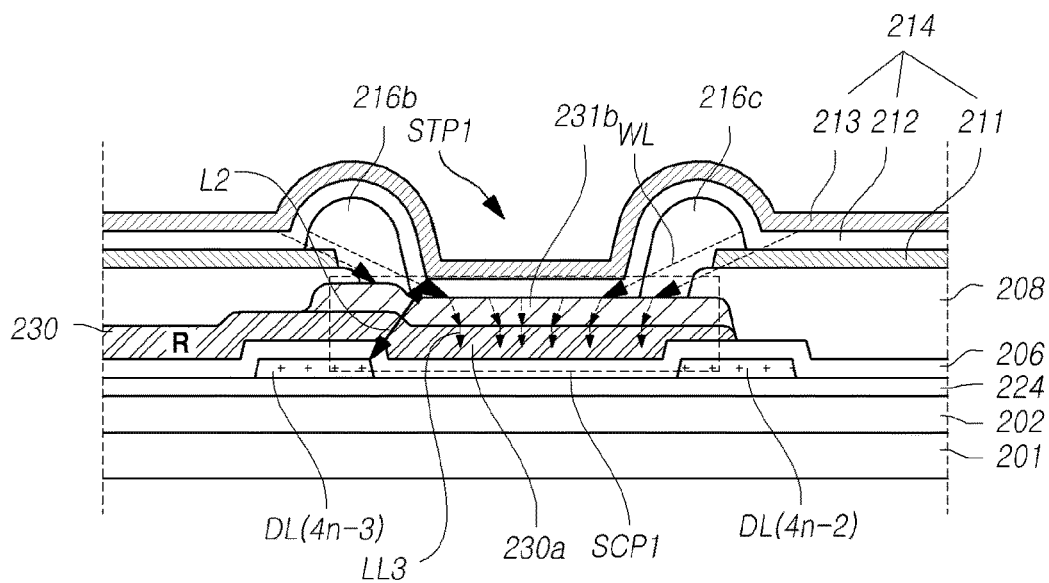

FIG. 9 is an enlarged cross-sectional view of a first step portion STP1 area X2, and it can be seen that a first step compensation portion SCP1 is formed in a structure in which a first red color pattern 230*a* and a second blue color pattern 231*b* are laminated. It is preferable that the first step compensation portion SCP1 is disposed to overlap with a part of the data lines DL(4*n*-3) and DL(4*n*-2) disposed at the lower portion and the area between the data lines DL(4*n*-3) and DL(4*n*-2). The reason is because, when the first step compensation portion SCP1 is not overlapped with the data lines DL(4n-3) and DL(4n-2), a light leakage defect may occur between the edge of the first step compensation portion SCP1 and the data lines DL(4n-3) and DL(4n-2).

In addition, in the first step portion STP1, a distance L2 between the second electrode 213 of the organic light emitting diode and the data lines DL(4n-3) and DL(4n-2) is increased as much as the thickness of the first step compensation portion SCP1. In other words, the distance L2 between the second electrode 213 and the data lines DL(4n-3) and DL(4n-2) is increased as much as the sum of the thicknesses of the first red color pattern 230a and the second blue color pattern 231b, to suppress a short circuit defect.

In addition, when there is white light WL traveling to the first step portion STP1 in light generated from the organic light emitting diode 214, the white light WL passes through the second blue color pattern 231b of the first step compensation portion SCP1, and then becomes third light LL3 having a wavelength band of 461 to 550 nm. In other words, since the third light LL3 is blue light having the wavelength band of 461 to 550 nm, the third light LL3 traveling to the first red color pattern 230a disposed under the second blue color pattern 231b does not pass through the first red color pattern 230a which allows only light having the wavelength band of 551 to 650 nm to pass, and the whole third light LL3 is absorbed. As described above, the first step compensation portion SCP1 of the present disclosure has an effect of removing a light leakage occurring in the first step portion STP1 area.

Figure 10:
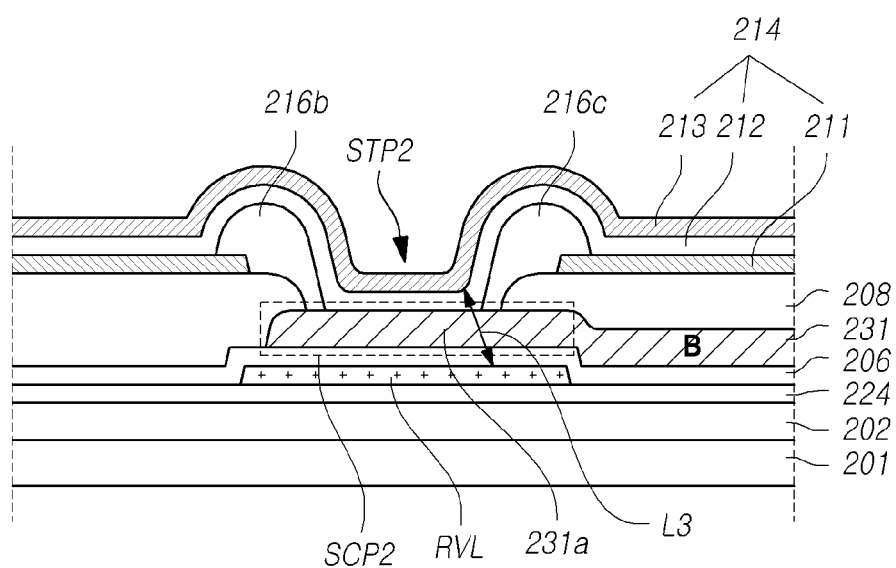

FIG. 10 is an enlarged cross-sectional view of a second step portion STP2 area Y2 and, in a structure of the second step portion STP2 area Y2, a protective film 206 is formed on a reference voltage line RVL and a second step compensation portion SCP2 is disposed on the protective film 206 to overlap with the reference voltage line RVL. In other words, the second step compensation portion SCP2 includes a first blue color pattern 231a, and is disposed on the protective film 206 to overlap with the reference voltage line RVL.

Accordingly, the downsides of the first bank layer and the second bank layer 216b and 216c are positioned on the second step compensation portion SCP2, and the second electrode 213 and the organic light emitting layer 212 positioned in the second step portion STP2 are disposed on the second step compensation portion SCP2 and the first and second bank layers 216b and 216c. Therefore, even in the second step portion STP2 area Y2, a distance L3 between the reference voltage line RVL and the second electrode 213 of the organic light emitting diode 214 is increased by the second compensation portion SCP2, and thus it is possible to suppress a short circuit defect.

Figure 11:
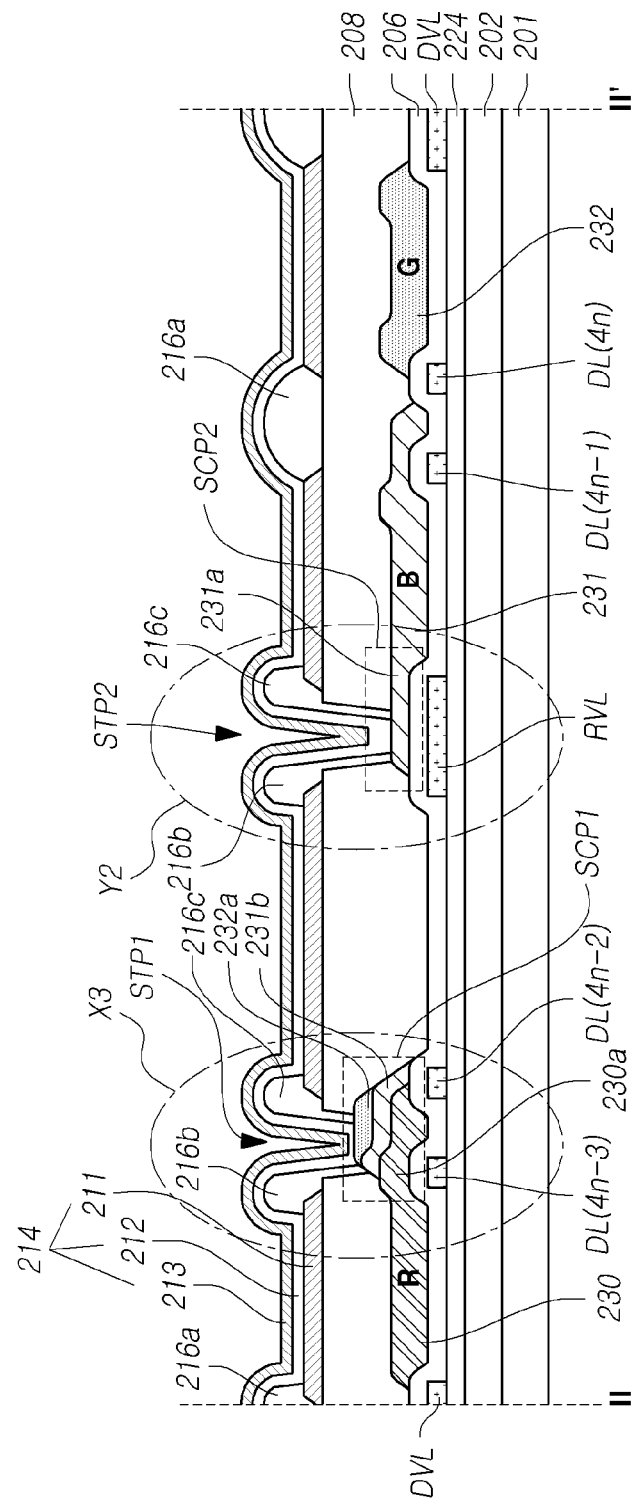
Figure 12:
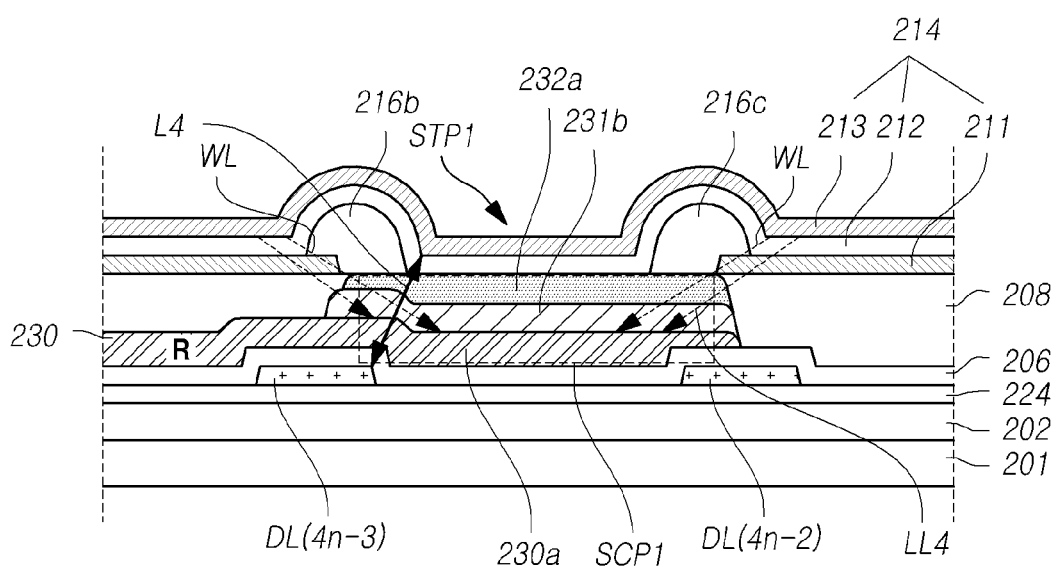

Referring FIG. 11 and FIG. 12, in another embodiment of the present disclosure, a first step compensation portion SCP1 in which a first red color pattern 230a, a second blue color pattern 231b, and a first green color pattern 232a are laminated is disposed in a first step portion STP1 area X3.

Accordingly, a depth of the first step portion STP1 is decreased as much as the first step compensation portion SCP1, a thickness of the first step compensation portion SCP1 is the sum of thicknesses of the first red color pattern 230a, the second blue color pattern 230b, and the first green color pattern 232a.

Therefore, in the first step portion STP1 area X3, a distance L4 between the second electrode 213 of the organic light emitting diode 214 and the data lines DL(4n-3) and DL(4n-2) is increased as much as the first step compensation portion SCP1, and it is possible to suppress a short circuit defect between the second electrode 213 and the data lines DL(4n-3) and DL(4n-2).

In addition, white light WL traveling to the first step portion STP1 area in light generated in the organic light emitting diode 214 passes through the green color pattern 232a of the first step compensation portion SCP1 and becomes fourth light LL4. Since the fourth light LL4 is green light having a wavelength band of 461 to 550 nm, the fourth light LL4 is input to the second blue color pattern 231b which is disposed under the green color pattern 232a and allows only light having the wavelength band of 461 to 550 nm to pass, does not pass, and is absorbed. Accordingly, it is possible to suppress a light leakage.

In addition, when the white light WL traveling to the first step portion STP1 area is directly input to the second blue color pattern 231b of the first step compensation portion SCP1, the light passing through the second blue color pattern 231b has only the blue wavelength band according to the phenomenon described in FIG. 9, thus does not pass through the first red color pattern 230a disposed thereunder, and is absorbed. As described above, the first step compensation portion SCP1 of the present disclosure has an effect of suppressing a short circuit defect between the first electrodes 211 disposed in each sub-pixel in the first step portion STP1 or between the first electrode 211 and the data lines DL(4n-3) and DL(4n-2), and removing a light leakage defect.

Figure 13:
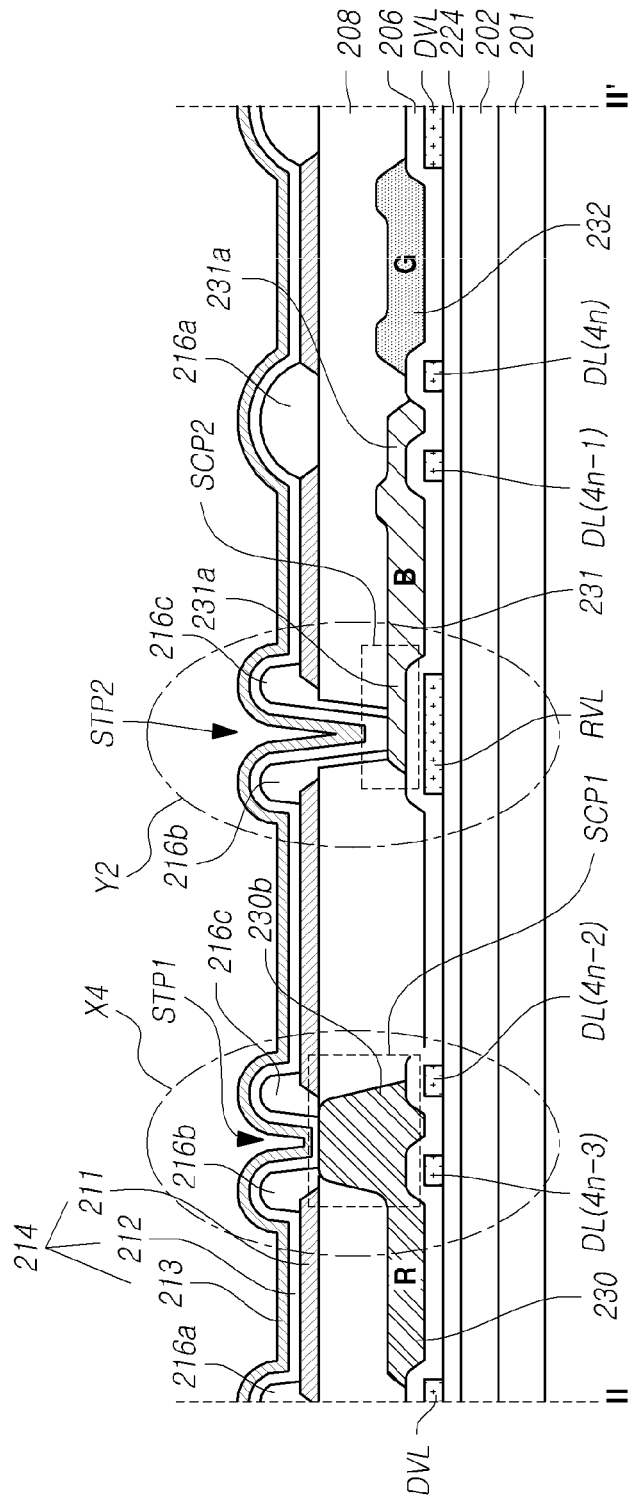
Figure 14:
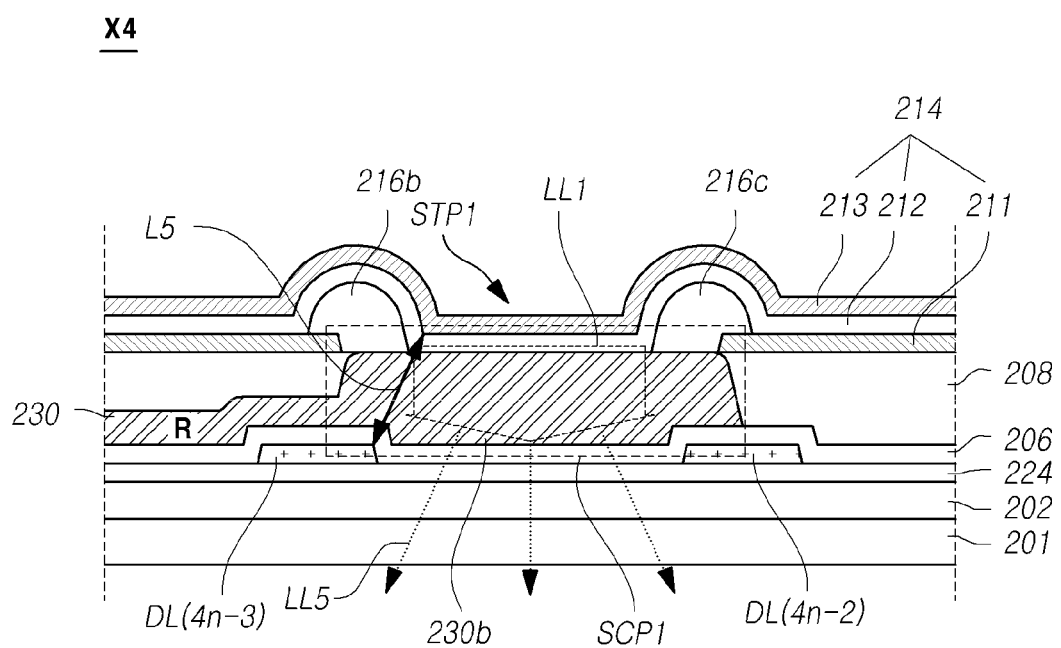

Referring to FIG. 13 and FIG. 14, in another embodiment of the present disclosure, a first step compensation portion SCP1 is disposed in a first step portion STP1 area X4. The first step compensation portion SCP1 includes a second red color pattern 230b, the second red color pattern 230b may be a color pattern formed to be thicker than a thickness of a red (R) color filter 230 using a halftone mask or diffraction mask process when forming the red (R) color filter 230.

For example, when red (R) resin is formed on a substrate 201 to form a red (R) color filter 230, the red (R) resin is formed as much as a thickness of the first red color pattern 230b, and then a part of the red (R) resin formed in a red (R) sub-pixel is removed to form the red (R) color filter 230 and the second red color pattern 230b together.

Accordingly, the second red color pattern 230b may be formed to be thicker than the thickness of the first red color pattern 230a described in FIG. 6. In addition, in the drawings, the second red color pattern 230b is formed integrally with the red (R) color filter 230, but may be embodied with blue or green resin at the time of forming the blue (B) color filter 231 or the green (G) color filter.

Referring to FIG. 14, a distance L5 between a second electrode 212 of an organic light emitting diode and data lines DL(4n-3) and DL(4n-2) is increased as much as a thickness of a second red color pattern 230b by a first step compensation portion SCP1 formed of a second red color pattern 230b disposed in a first step portion STP1. Accordingly, the distance L5 between the second electrode 212 of the organic light emitting diode and the data lines DL(4n-3) and DL(4n-2) is increased, and thus it is possible to suppress a short circuit defect.

In addition, since the first step compensation portion SCP1 is formed of the second color pattern 230b thicker than the first red color pattern 230a illustrated in FIG. 6, fifth light LL5 with luminance lower than that of the second light LL2 passing through the first red color pattern 230a passes, and it is possible to further suppress a light leakage as compared with FIG. 6. Since the first light LL1 (white light) including all of blue, green, and red wavelength bands passes through the second red color pattern 230b, the fifth light LL5 also becomes red light having only the wavelength band of 551 to 650 nm.

FIG. 15a to FIG. 15d are diagrams illustrating a pixel structure of an organic light emitting display device according to another embodiment of the present disclosure. In the drawings, R indicates a red (R) sub-pixel area in which a red (R) color filter is disposed, B indicates a blue (B) sub-pixel area in which a blue (B) color filter is disposed, and G indicates a green (G) sub-pixel area in which a green (G) color filter is disposed. For convenience of description, R, W, B, and G mean an emission area EA corresponding to color filters in sub-pixel areas, but may be mentioned including a non-emission area NEA in some cases.

Figure 15A:
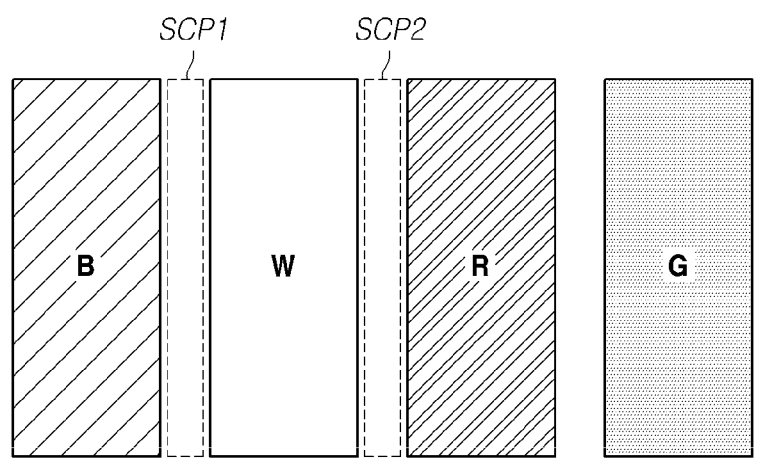
FIG. 15A through FIG. 15D are diagrams illustrating a pixel structure of an organic light emitting display device according to another embodiment of the present disclosure.
Figure 15B:
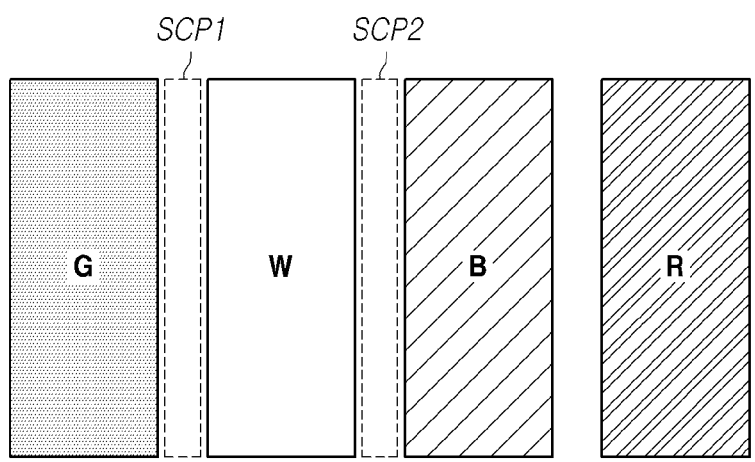
Figure 15C:
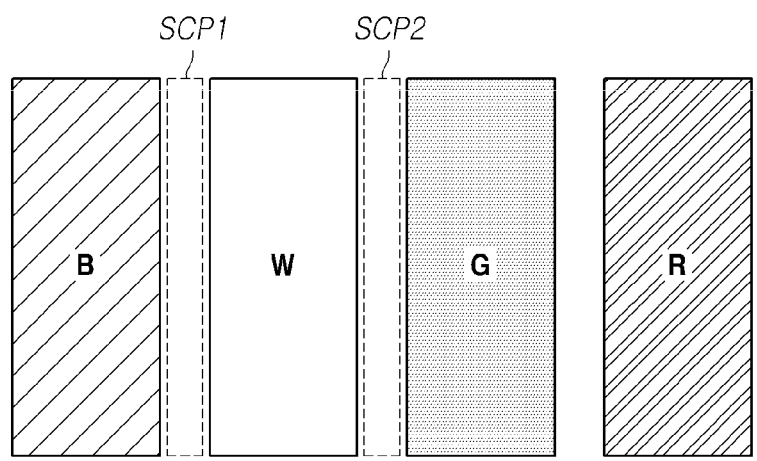
Figure 15D:
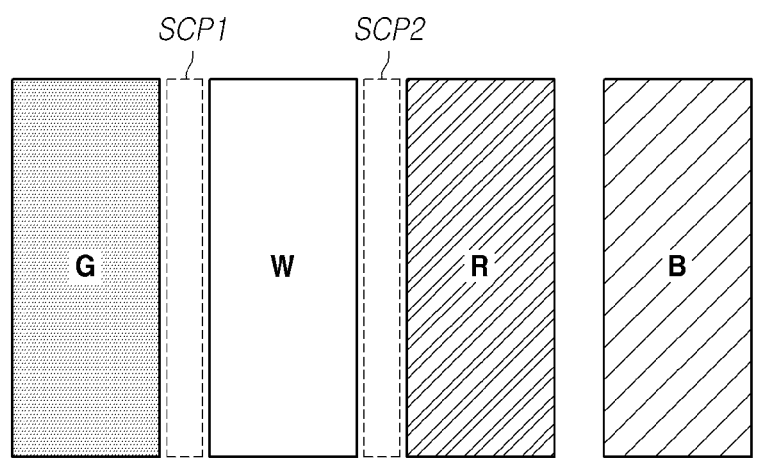

In addition, in FIG. 15a to FIG. 15b, it is illustrated that first and second step compensation portions SCP1 and SCP2 are disposed on both sides with respect to the white (W) sub-pixel but, as illustrated in FIG. 2, the step compensation portion may be disposed only between the white (W) sub-pixel and the one adjacent sub-pixel.

Referring to FIG. 15a to FIG. 15d, in FIG. 2 to FIG. 14, the pixel structure including RWBG sub-pixels has been mainly described, but this is not fixed, and a pixel structure may have, for example, BWRG, GWBR, BWGR, and GWRB. In addition, although not illustrated in the drawings, the position of the white (W) sub-pixel may be the first, third, or fourth of four sub-pixels, and the red (R), blue (B), and green (G) sub-pixels may be disposed at various positions adjacent based thereon.

As illustrated in FIG. 15a, when the pixel structure is BWGR, the first step compensation portion SCP1 disposed in the first step portion between the blue (B) sub-pixel and the white (W) sub-pixel may be formed of a blue color pattern expanded from the blue (B) color filter or an overlap structure of the blue color pattern and the red (R) or green (G) color pattern. In some cases, as illustrated in FIG. 11 and FIG. 12, the first step compensation portion SCP1 may be formed in a structure in which three different color patterns are laminated.

In addition, the second step compensation portion SCP2 disposed in the second step portion between the white (W) sub-pixel and the red (R) sub-pixel may be formed of a red color pattern formed simultaneously with the red (R) color filter.

As described above, even in FIG. 15b to FIG. 15d, the first and second step compensation portions SCP1 and SCP2 may be formed in a structure in which at least one color pattern is laminated, according to colors of sub-pixels adjacent to the white (W) sub-pixel.

As illustrated in FIG. 15a to FIG. 15d, the organic light emitting display device according to the other embodiments of the present disclosure also has an effect of suppressing a short circuit defect between electrodes or between an electrode and data lines (or reference voltage line) and a short circuit defect between an electrode of an organic light emitting diode and signal lines by step compensation portions disposed between sub-pixels.

Furthermore, the step compensation portions disposed between the sub-pixels have a laminated structure of color patterns, and have an effect of reducing and blocking a light leakage according to the phenomenon described in FIG. 2 and FIG. 14.

FIG. 16 is a plan view illustrating a structure of a pixel disposed in a display panel of an organic light emitting display device according to another embodiment of the present disclosure, FIG. 17 is a cross-sectional view taken along the line III-III' of FIG. 16, and FIG. 18 to FIG. 20 are diagrams illustrating embodiments for a second step compensation portion of an organic light emitting display device according to the present disclosure.

The reference signs are those of FIG. 5 or FIG. 8 denote the same constituent elements and, hereinafter, a discriminated third step portion STP3 will be mainly described.

Referring to FIG. 16 to FIG. 20, in an organic light emitting display device according to another embodiment of the present disclosure, a first step compensation portion SCP1 is disposed between the red (R) sub-pixel SP1 and the white (W) sub-pixel SP2, a second step compensation portion SCP2 is disposed between the white (W) sub-pixel SP2 and the blue (B) sub-pixel SP3, and a third step compensation portion SCP3 is disposed between the blue (B) sub-pixel SP3 and the green (G) sub-pixel SP4.

Figure 18:
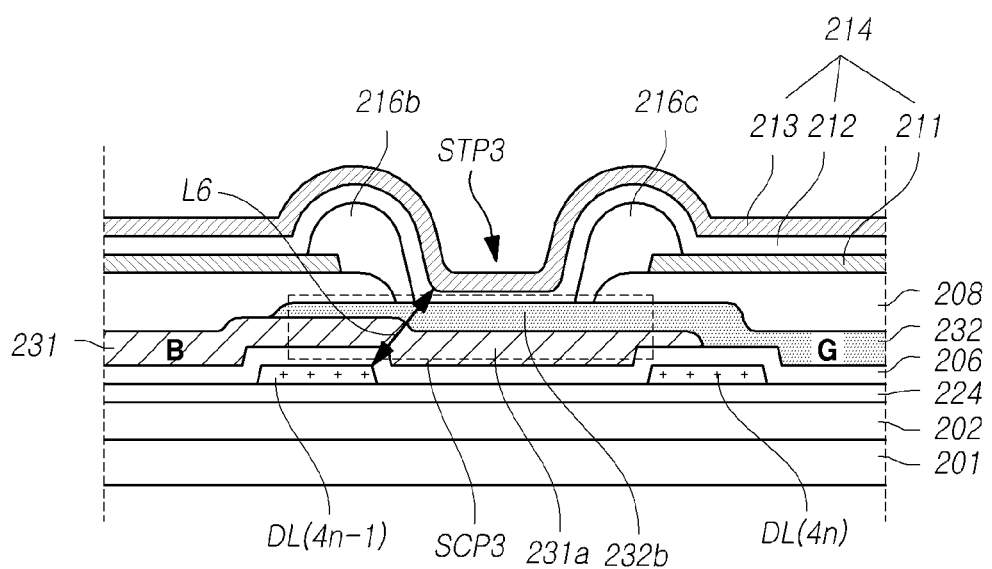
FIG. 18 through FIG. 20 are diagrams illustrating a structure of a third step portion area of an organic light emitting display device according to the present disclosure.

Particularly, as illustrated in FIG. 18, in a structure of the third step portion STP3 area Z1, the third step compensation portion SCP3 is disposed to overlap with the data lines DL(4n-1) and DL(4n) between the blue (B) sub-pixel SP3 and the green (G) sub-pixel.

The third step compensation portion SCP3 is formed in a structure in which a first blue color pattern 231a expanded and formed from the blue (B) color filter and a second green color pattern 232b are laminated. In addition, the third step compensation portion SCP3 is disposed to overlap with a part of the data lines DL(4n-1) and DL(4n) and a portion between the data lines DL(4n-1) and DL(4n).

Accordingly, a distance L6 between the second electrode 213 of the organic light emitting diode and the data lines DL(4n-1) and DL(4n) is increased as much as a thickness of the third step compensation portion SCP3, to suppress a short circuit defect between the second electrode 213 and the data lines DL(4n-1) and DL(4n).

In addition, white light of the organic light emitting diode 214 traveling to the third step portion STP3 passes through the first blue color pattern 231a according to the light leakage block phenomenon described above, and then is blocked at the second green color pattern 232b, thereby suppressing a light leakage defect.

Figure 19:
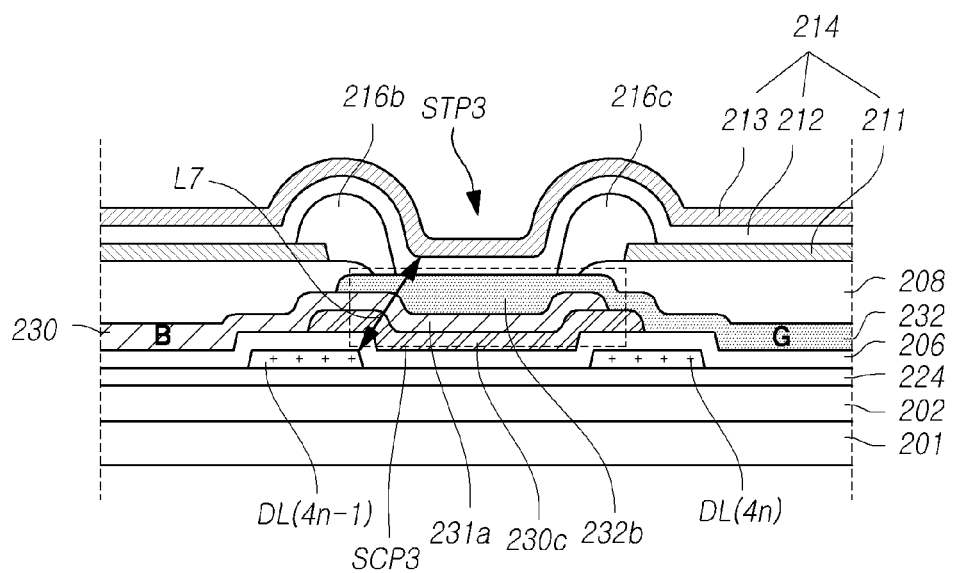

FIG. 19 illustrating another embodiment of a third step portion STP3 area Z2 and, as illustrated in the drawing, the third step compensation portion SCP3 is formed in a laminated structure of a third red color pattern 230c, a first blue color pattern 231a, and a second green color pattern 232b.

Accordingly, a distance L7 between the second electrode 213 of the organic light emitting diode and the data lines DL(4n-1) and DL(4n) is increased as much as the third step compensation portion SCP3, to suppress a short circuit defect between the second electrode 213 and the data lines DL(4n-1) and DL(4n).

In addition, white light traveling to the third step portion STP3 is blocked at the third red color pattern 230c or the first blue color pattern 231a according to the phenomenon described in FIG. 11 and FIG. 12, to suppress a light leakage defect occurring in the third step portion STP3 area.

Figure 20:
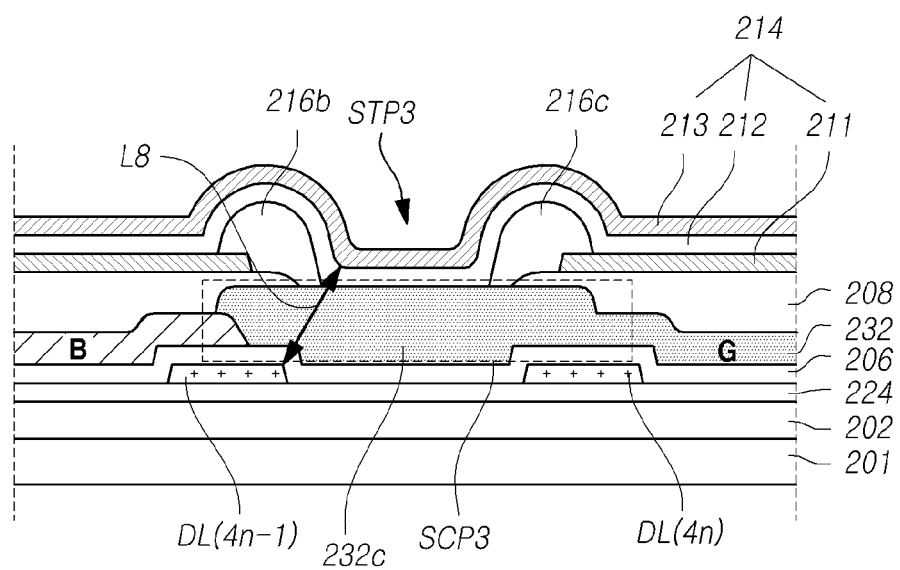

FIG. 20 is a diagram illustrating another embodiment of a third step portion STP3 area Z3 and, when a green (G) color filter 232 is formed, a third step compensation portion SCP3 formed of a third green color pattern 232c is formed in the third step portion STP3 using a halftone or diffraction mask process.

A distance L8 between a second electrode 213 of an organic light emitting diode and the data lines DL(4n-1) and DL(4n) is increased as much as a thickness of the third green color pattern 232c, to suppress a short circuit defect between the second electrode 213 and the data lines DL(4n-1) and DL(4n).

In addition, only green light having a wavelength band of 461 to 550 nm of white light traveling in a direction of the third step portion STP3 passes through the third green color pattern 232c, to reduce a light leakage, according to the phenomenon described in FIG. 14.

Figure 21:
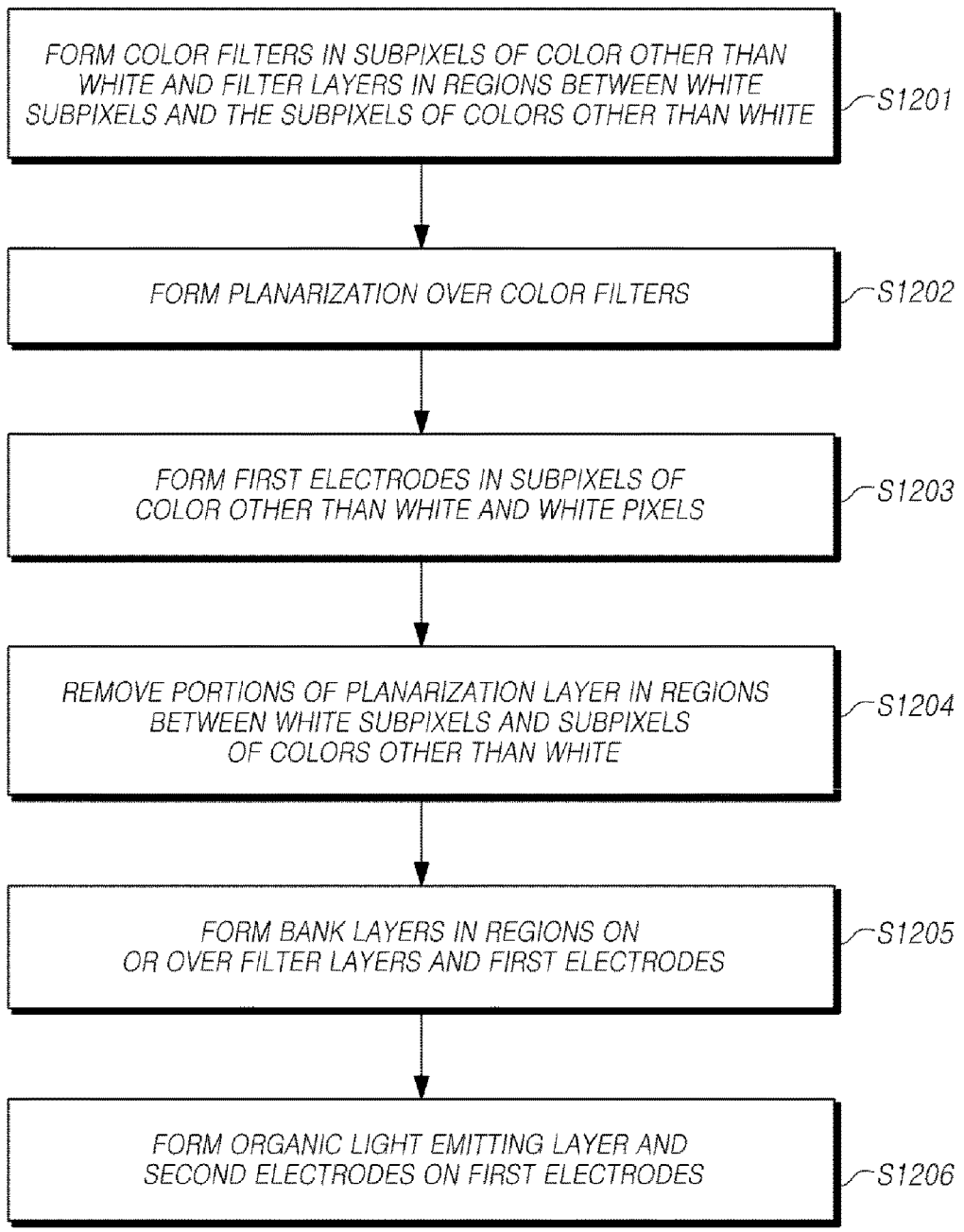
FIG. 21 is a flowchart illustrating a process of manufacturing the display panel according to one embodiment of the present disclosure.

FIG. 21 is a flowchart illustrating a process of manufacturing the display panel according to one embodiment of the present disclosure. Referring to the embodiment of FIG. 5, light shield layer (LS) is formed on selective areas of the substrate 201.

The buffer layer 202 is formed on the substrate 201. The active layer 204 of the driving transistors D1 are formed on the substrate 201 followed by the formation of the interlayer insulating film 224 on the substrate 201.

The drain electrodes 207a and the source electrodes 207b of the driving transistors D1 are formed on the substrate 201. The reference voltage lines RVL and the data lines DL (4n), DL(4n-1), DL(4n-2) and DL(4n-3) may be formed during the process of forming the drain electrodes 207a and the source electrodes 207b.

The protective film 206 is formed on the data lines DL(4n-1), DL(4n-2) and DL(4n-3), the reference voltage lines RVL, the interlayer insulating film 224, drain electrodes 207a and the source electrodes 207b.

Color filters 230, 231, 232 are then formed S1201 in subpixels of color other than white and filter layers in regions between white subpixels and the subpixels of colors other than white. For embodiments of FIG. 13 where the thickness of color filters are different, a halftone mask or a diffraction mask may be used.

A planarization layer 208 is formed S1202 over the color filters and the protective film 206. Then, the planarization layer 208 is removed S1203 from selected portions of the substrate using a mask process. Specifically, the planarization layer 208 may be removed, for example, by etching at regions between white subpixels and subpixels of colors other than white.

A metal layer is formed and then selectively removed by a mask process to form S1204 the first electrodes 211 of the OLED 214. The metal layer may include materials such as ITO, IZO, ITO/APC/ITO, AlNd/ITO, Ag/ITO or ITO/APC/ITO.

The bank layers 216a, 216b, 216c are then formed S1205 on the selected regions over the planarization layer 208 and the first electrodes 211.

After forming the bank layers 216a, 216b, 216c, an organic light emitting layer 212 is formed S1206. Then the second electrodes 213 are formed S1206 on the organic light emitting layer 212 to complete the OLED 214.

As described above, in the organic light emitting display device according to the present disclosure, the step compensation portion is disposed between the sub-pixels, to suppress a short circuit defect between the pixel electrodes and a short circuit defect between the electrode of the organic light emitting diode and the signal lines.

In addition, in the organic light emitting display device according to the present disclosure, the step compensation portion formed of at least one color pattern is disposed in the step portion area formed between the sub-pixels, to suppress a short circuit defect and a light leakage defect.

The above description and the accompanying drawings just exemplarily represent the technical spirit of the present disclosure, and those skilled in the art can variously modify and change the configurations such as coupling, separation, replacement, and variation of configurations, within the scope which does not depart from the essential features of the present disclosure. Accordingly, the embodiments described in the present disclosure are not to limit the technical spirit of the present disclosure, but to describe, and the scope of the technical spirit of the present disclosure is not limited by such embodiments. The protective scope of the present disclosure should be interpreted by the following Claims, and all the technical spirits within the scope equivalent thereto should be interpreted as being included in the right scope of the present disclosure.

While the present invention has been illustrated and described in connection with the exemplary embodiments, it will be apparent to those skilled in the art that modifications and variations can be made without departing from the spirit and scope of the invention as defined by the appended claims.

What is claimed is:

1. A method of manufacturing an organic light emitting diode (OLED) device, comprising:
   forming color filters in subpixels of color other than white and filter layers in regions between white subpixels and the subpixels of colors other than white;
   forming a planarization layer at least over the color filters;
   forming first electrodes in the subpixels of color other than white and the white subpixels;
   removing portions of the planarization layer in the regions between the white subpixels and the subpixels of colors other than white; and
   forming bank layers in the regions on or over the filter layers and over the first electrodes.

2. The method of claim 1, further comprising:
   forming data lines on a substrate; and
   forming a protective layer over the data lines and the substrate.

3. The method of claim 2, further comprising:
   forming an organic light emitting layer on the first electrodes; and
   forming second electrodes on the organic light emitting layer.

4. The method of claim 2, wherein the bank layers comprise a first bank layer at least partially overlapping one of the filter layers and one of the data lines, and a second bank layer overlapping the one of the filter layers and the other of the data lines.

5. The method of claim 4, wherein the first bank layer and the second bank layer contact the one of the filter layers.

6. The method of claim 1, wherein forming the color filters and the filter layers comprise using a halftone mask or a diffraction mask to make the filter layers in the regions thicker than the color filter in the subpixels of color other than white.

7. The method of claim 1, wherein the filter layers extend from the color filters.

8. The method of claim 1, wherein at least a subset of the filter layers are formed by overlapping two or more color filters.

9. The method of claim 1, wherein the filter layers are disposed at least partially on two metal lines separated on a substrate.

10. The method of claim 9, wherein the two metal lines are adjacent data lines.

* * * * *